(12) United States Patent
Sugihara et al.

(10) Patent No.: US 10,969,685 B2
(45) Date of Patent: Apr. 6, 2021

(54) PHOTORESIST COMPOSITION

(71) Applicant: SUMITOMO CHEMICAL COMPANY, LIMITED, Tokyo (JP)

(72) Inventors: Masako Sugihara, Osaka (JP); Maki Kawamura, Osaka (JP); Maiko Goda, Osaka (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 0 days.

(21) Appl. No.: 14/491,120

(22) Filed: Sep. 19, 2014

(65) Prior Publication Data

US 2015/0086927 A1 Mar. 26, 2015

(30) Foreign Application Priority Data

Sep. 24, 2013 (JP) .............................. JP2013-196744

(51) Int. Cl.
*G03F 7/038* (2006.01)
*G03F 7/039* (2006.01)

(52) U.S. Cl.
CPC .......... *G03F 7/0388* (2013.01); *G03F 7/0392* (2013.01)

(58) Field of Classification Search
CPC ...... G03F 7/004; G03F 7/0045; G03F 7/0388; G03F 7/0392; G03F 7/0397
See application file for complete search history.

(56) References Cited

U.S. PATENT DOCUMENTS

| | | | | |
|---|---|---|---|---|
| 5,962,180 A * | 10/1999 | Iwanaga et al. | ............... | 430/170 |
| 6,133,412 A * | 10/2000 | Malik | ................... | C08F 257/02 |
| | | | | 524/742 |
| 6,156,481 A * | 12/2000 | Takeda et al. | ............. | 430/270.1 |
| 6,228,661 B1 * | 5/2001 | Li | ..................... | 438/8 |
| 2003/0054287 A1 * | 3/2003 | Yasunami | ............. | G03F 7/0045 |
| | | | | 430/270.1 |
| 2003/0219603 A1 * | 11/2003 | Teng et al. | ..................... | 428/414 |
| 2004/0076902 A1 * | 4/2004 | Nakanishi | ............. | G03F 7/0045 |
| | | | | 430/270.1 |
| 2006/0222997 A1 | 10/2006 | Kobayashi et al. | | |
| 2008/0118867 A1 * | 5/2008 | Sato | ...................... | G03F 7/0007 |
| | | | | 430/286.1 |
| 2010/0173245 A1 * | 7/2010 | Wang et al. | ............... | 430/270.1 |
| 2013/0056654 A1 * | 3/2013 | Hatakeyama | ............. | G03F 1/00 |
| | | | | 250/492.3 |
| 2013/0260109 A1 * | 10/2013 | Akiyama | ................ | G03F 7/029 |
| | | | | 428/195.1 |
| 2014/0154624 A1 * | 6/2014 | Liu et al. | ................... | 430/270.1 |

FOREIGN PATENT DOCUMENTS

| | | | |
|---|---|---|---|
| CN | 104781731 | A | 7/2015 |
| JP | 9-6003 | A | 1/1997 |
| JP | 2004-138758 | A | 5/2004 |
| JP | 2004-347951 | A | 12/2004 |
| JP | 2008-46594 | A | 2/2008 |
| JP | 2011-75864 | A | 4/2011 |
| JP | 2016-502142 | A | 1/2016 |
| TW | 201428426 | A | 7/2014 |
| WO | WO 2011/013664 | * | 2/2011 |
| WO | WO 2014/086846 | A2 | 6/2014 |

OTHER PUBLICATIONS

Hackh's Chemical Dictionary, McGraw-Hill Book Company, 1969, p. 509 (Year: 1969).*
Machine translation of WO 2011/013664, published on Feb. 3, 2011 (Year: 2011).*
Machine translation of JP 2004-138758, published May 13, 2004 (Year: 2004).*
Japanese Notification of Reasons for Refusal (including an English translation thereof) issued in the corresponding Japanese Patent Application No. 2014-190901 dated Mar. 13, 2018.
Taiwanese Examination Report and Search Report (including an English translation thereof) issued in the corresponding Taiwanese Patent Application No. 103132596 dated Jul. 13, 2018.
Chinese Office Action and Search Report, dated Mar. 25, 2019, for Chinese Application No. 201410478878.6, with an English translation.
Japanese Office Action, dated Apr. 23, 2019, for Japanese Application No. 2018-090406, with an English translation.
Japanese Office Action, dated Dec. 8, 2019, for Japanese Application No. 2018-090406, with English translation.
Korean Office Action (including English translation thereof) issued in the corresponding Korean Patent Application No. 10-2014-0125096 dated Aug. 24, 2020.

* cited by examiner

*Primary Examiner* — Anca Eoff
(74) *Attorney, Agent, or Firm* — Birch, Stewart, Kolasch & Birch, LLP

(57) ABSTRACT

A photoresist composition comprising:
a resin which has an acid-labile group;
an acid generator;
a compound which has a sulfide bond and a mercapto group; and a solvent.

3 Claims, 1 Drawing Sheet

PHOTORESIST COMPOSITION

This nonprovisional application claims priority under 35 U.S.C. § 119(a) on Patent Application No. 2013-196744 filed in JAPAN on Sep. 24, 2013, the entire contents of which are hereby incorporated by reference.

FIELD OF THE INVENTION

The present invention relates to a photoresist composition and a method for producing a photoresist pattern.

BACKGROUND OF THE INVENTION

The electrodes which is a bump with height 4 to 150 μm are aligned on a substrate in a process of mounting pins by a thin film for semiconductor chips.

As to photoresist compositions for producing a bump, JP2011-75864A1 mentions a photoresist composition which comprises a resin comprising a structural unit derived from p-hydroxystylene. JP2004-347951A1 mentions a photoresist composition which comprises 1,3,5-triazine-2,4,6-trithiol or 1-thioglycerol.

SUMMARY OF THE INVENTION

The present application provides the inventions as follow.
[1] A photoresist composition comprising:
  a resin which has an acid-labile group;
  an acid generator;
  a compound which has a sulfide bond and a mercapto group; and a solvent.
[2] The photoresist composition according to [1], wherein the compound is a heterocyclic compound which has a sulfide bond and a mercapto group.
[3] The photoresist composition according to [2], wherein the heterocyclic compound is represented by formula (IA)

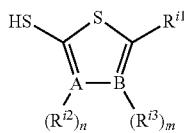

where $R^{i1}$ represents a hydrogen atom, $-SR^1$, $-NR^2R^3$, a C1-C10 aliphatic hydrocarbon group, a C3-C18 alicyclic hydrocarbon group, or a C6-C14 aromatic hydrocarbon group;
$R^1$ represent a hydrogen atom, a C1-C12 acyl group, a C1-C10 aliphatic hydrocarbon group, a C3-C10 alicyclic hydrocarbon group, or a C6-C14 aromatic hydrocarbon group,
$R^2$ and $R^3$ each independently represent a hydrogen atom, a C1-C12 acyl group where a hydrogen atom can be replaced by a hydroxyl group, a C1-C10 aliphatic hydrocarbon group where a hydrogen atom can be replaced by a hydroxyl group, a C3-C10 alicyclic hydrocarbon group where a hydrogen atom can be replaced by a hydroxyl group, or a C6-C14 aromatic hydrocarbon group where a hydrogen atom can be replaced by a hydroxyl group;
$R^{i2}$ and $R^{i3}$ each independently represent a hydrogen atom, a C1-C10 aliphatic hydrocarbon group, a C3-C18 alicyclic hydrocarbon group, or a C6-C14 aromatic hydrocarbon group;
A and B each independently represent a nitrogen atom or a carbon atom; and
"n" and "m" each independently represent 0 or 1.
[4] The photoresist composition according to [1], wherein the compound is a polymer which comprises a moiety having a sulfide bond and a mercapto group at a side chain.
[5] The photoresist composition according to any one of [1] to [4], wherein the resin has a group represented by formula (1) or (2):

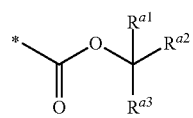

wherein $R^{a1}$, $R^{a2}$ and $R^{a3}$ independently each represent a C1-C8 alkyl group or a C3-C20 alicyclic hydrocarbon group, or two of $R^{a1}$, $R^{a2}$ and $R^{a3}$ are bonded each other to form a C2-C20 divalent hydrocarbon group and the other is a C1-C8 alkyl group or a C3-C20 alicyclic hydrocarbon group, and * represents a binding position.

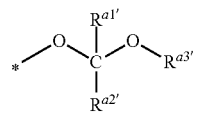

wherein $R^{a1'}$ and $R^{a2'}$ independently each represent a hydrogen atom or a C1-C12 hydrocarbon group where a methylene group can be replaced by an oxygen atom or a sulfur atom, and $R^{a3'}$ represents a C1-C20 hydrocarbon group where a methylene group can be replaced by an oxygen atom or a sulfur atom,
or one of $R^{a1'}$ and $R^{a2'}$ represents a hydrogen atom or a C1-C12 hydrocarbon group where a methylene group can be replaced by an oxygen atom or a sulfur atom, and the other is bonded to $R^{a3'}$ to form a C2-C20 divalent hydrocarbon group where a methylene group can be replaced by an oxygen atom or a sulfur atom, and * represents a binding position.
[6] The photoresist composition according to anyone of [1] to [5], wherein the resin is obtained by reacting
a resin which has a functional group selected from the group consisting of a carboxy group and phenolic hydroxyl groups at a side chain
with a compound which has at least two vinyloxy groups.
[7] A process for producing a photoresist pattern comprising:
  (1) a step of applying the photoresist composition according to any one of [1] to [6] on a substrate,
  (2) a step of forming a photoresist composition film by drying the photoresist composition,
  (3) a step of exposing the photoresist composition film, and
  (4) a step of developing the exposed photoresist composition film.

The photoresist composition of the present invention can provide a photoresist pattern with good shape.

BRIEF DESCRIPTION OF DRAWINGS

FIG. 1(*a*) illustrates an excellent cross-sectional view of a photoresist pattern which has substantially rectangle shape at its top and bottom portions. FIG. 1(*b*) illustrates a cross-sectional view of a photoresist pattern which has a round shape at its bottom portion.

DESCRIPTION OF TIE PREFERRED INVENTION

Figures 1A, 1B:
FIGS. 1(a) and 1(b) each independently illustrate a schematic cross-sectional view of contact hole patterns.

The photoresist composition of the present invention comprises:
a resin which has an acid-labile group;
an acid generator;
a compound which has a sulfide bond and a mercapto group; and a solvent.

Herein, the term "(meth)acrylate" means one or both of acrylates and methacrylates, and the term "(meth)acryl acid" means one or both of acryl acids and methacryl acids.

Herein, the term "a" and "an" respectively mean "at least one".

<Compound (I)>

The compound has a sulfide bond and a mercapto group, which is sometimes referred to as "Compound (I)".

Compound (I) is preferably a heterocyclic compound which has a sulfide bond and a mercapto group.

For the heterocyclic compound, a heterocyclic ring may have a sulfide bond.

The heterocyclic ring may be a monocyclic ring or a polycyclic ring, which is preferably a monocyclic ring.

It may be a saturated ring or an unsaturated ring, which is preferably an unsaturated ring.

It is more preferably a monocyclic unsaturated ring.

For the heterocyclic compound, a mercapto group may be bonded directly to the heterocyclic ring or to a substituent on the heterocyclic ring, preferably directly to the heterocyclic ring. The heterocyclic ring has preferably 2 to 12 carbon atoms, more preferably 2 to 6 carbon atoms.

The heterocyclic ring has preferably a sulfide bond, more preferably a sulfide bond and a hetero atom other than a sulfur atom.

Examples of such hetero atom include an oxygen atom, and a nitrogen atom, preferably a nitrogen atom.

Specific examples of the heterocyclic ring which has a sulfide bond include the following ones.

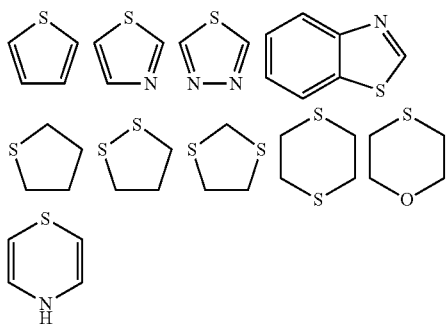

Compound (I) may be a monomer, an oligomer, or a polymer which polymer is sometimes referred as to Polymer (I).

Herein, the "oligomer" refers to those which comprises two or more structural units having a sulfide bond and a mercapto group in its side chain and which has weight average molecular weight less than 3000.

Polymer (I) comprises preferably a moiety having a sulfide bond and a mercapto group in its side chain, more preferably a moiety which has a heterocyclic ring having a sulfide bond and a mercapto group at its side chain.

When Polymer (I) comprises a moiety having a sulfide bond and a mercapto group at its side chain, the moiety is preferably attached to the main chain of the polymer via a linking group which comprises a C1-C20 divalent hydrocarbon group as well as an amide bond, an ether bond, a thioether bond, an oxycarbonyl group or a carbonyloxy group.

Polymer (I) may be a homopolymer or a copolymer.

Polymer (I) may comprise any other structural unit such as a structural unit having an acid-labile group or a structural unit having no acid-labile group described later.

Polymer (I) comprises preferably a structural unit having no acid-labile group, more preferably a structural unit derived from a hydroxystylene where a hydroxyl group can be protected with a hydrocarbon group, examples of which include a structural unit represented by formula (a2-1) and formula (a1-2) described later, in addition to a structural unit having a moiety having a sulfide bond and a mercapto group at its side chain. Polymer (I) comprises a structural unit which has a moiety having a sulfide bond and a mercapto group at its side chain, in an amount of usually 0.1 to 50 mol %, preferably 0.5 to 30 mol %, and more preferably 1 to 20 mol % of the total structural units. The weight average molecular weight of polymer (I) is usually 3000 or more, preferably 5000 or more, while it is usually 100000 or less, preferably 50000 or less.

The weight average molecular weight is determined by gel permeation chromatography analysis using standard polystyrene as a standard reference material, as described later in Examples.

Compound (I) is preferably a compound represented by formula (IA).

where R represents a hydrogen atom, $-SR^1$, $-NR^2R^3$, a C1-C10 aliphatic hydrocarbon group, a C3-C18 alicyclic hydrocarbon group, or a C6-C14 aromatic hydrocarbon group;

$R^1$ represents a hydrogen atom, a C1-C12 acyl group, a C1-C10 aliphatic hydrocarbon group, a C3-C10 alicyclic hydrocarbon group, or a C6-C14 aromatic hydrocarbon group;

$R^2$ and $R^3$ each independently represent a hydrogen atom, a C1-C12 acyl group where a hydrogen atom can be replaced by a hydroxyl group, a C1-C10 aliphatic hydrocarbon group where a hydrogen atom can be replaced by a hydroxyl group, a C3-C10 alicyclic hydrocarbon group where a hydrogen atom can be replaced by a hydroxyl group, or a C6-C14 aromatic hydrocarbon group where a hydrogen atom can be replaced by a hydroxyl group;

$R^{i2}$ and $R^{i3}$ each independently represent a hydrogen atom, a C1-C10 aliphatic hydrocarbon group, a C3-C18 alicyclic hydrocarbon group, or a C6-C14 aromatic hydrocarbon group;

A and B each independently represent a nitrogen atom or a carbon atom; and

"n" and "m" each independently represent 0 or 1.

In formula (IA), examples of aliphatic hydrocarbon group include alkyl groups such as a methyl group, an ethyl group, a propyl group, a butyl group, a pentyl group, a hexyl group, a heptyl group, an octyl group.

In formula (IA), the alicyclic hydrocarbon groups may be a monocyclic or polycyclic one.

Examples of the alicyclic hydrocarbon group represented by $R^1$, $R^2$ or $R^3$ include a monocyclic alicyclic hydrocarbon group such as a C3-C10 cycloalkyl group and a polycyclic alicyclic hydrocarbon group such as a decahydronaphthyl group, an adamantyl group, and a norbornyl group.

Examples of the alicyclic hydrocarbon group represented by $R^{i1}$, $R^{i2}$ or $R^{i3}$ include a monocyclic alicyclic hydrocarbon group such as a C3-C18 cycloalkyl group (e.g. a cyclopentyl group, a cyclohexyl group, a cycloheptyl group and a cyclooctyl group) and a polycyclic alicyclic hydrocarbon group such as a decahydronaphthyl group, an adamantyl group, and a norbornyl group.

Herein, the "aromatic hydrocarbon group" refers to a group which consists of an aromatic hydrocarbon ring as well as a group which comprises an aromatic hydrocarbon ring and a saturated hydrocarbon group.

Examples of the aromatic hydrocarbon groups include aryl groups such as a phenyl group, a naphthyl group, an antryl group, p-methylphenyl group, p-tert-butylphenyl group, a p-adamantylphenyl group, a tolyl group, a xylyl group, a cumenyl group, a mesityl group, a biphenyl group, a phenanthryl group, a 2,6-diethylphenyl group, 2-methyl-6-ethylphenyl group. Examples of the acyl group include an acetyl group, a propionyl group, a butyryl group, a vareyl group, a hexylcarbonyl group, a heptylcarbonyl group, an octylcarbonyl group, a decylcarbonyl group, a dodecycarbonyl group and a benzoyl group.

$R^1$ is preferably a hydrogen atom, a C1-C10 aliphatic hydrocarbon group or a C1-C12 acyl group, more preferably a C1-C10 aliphatic hydrocarbon group or a C1-C12 acyl group, still more preferably a C1-C5 aliphatic hydrocarbon group or a C2-C7 acyl group. Each of $R^2$ and $R^3$ is preferably a hydrogen atom, a C1-C10 aliphatic hydrocarbon group, a C6-C14 aromatic hydrocarbon group, or a C1-C12 acyl group, more preferably a hydrogen atom, a C1-C5 alkyl group, a C6-C14 aromatic hydrocarbon group, or a C1-C12 acyl group.

$R^{i1}$ is preferably a hydrogen atom or —$SR^1$ where $R^1$ is a C1-C4 alkyl group, more preferably a hydrogen atom or a mercapto group, and still more preferably a mercapto group.

Each of $R^{i2}$ and $R^{i3}$ is preferably a hydrogen atom, a C1-C10 aliphatic hydrocarbon group, a C3-C18 alicyclic hydrocarbon group, or a C6-C14 aromatic hydrocarbon group, more preferably a hydrogen atom or a C1-C10 aliphatic hydrocarbon group, still more preferably a hydrogen atom or a C1-C4 alkyl group, and further more preferably a hydrogen atom.

It is preferred that one or both of A and B are nitrogen atoms, and it is more preferred that both of them are nitrogen atoms.

Examples of preferred Compound (I) further include a polymer which comprises a structural unit represented by formula (IB).

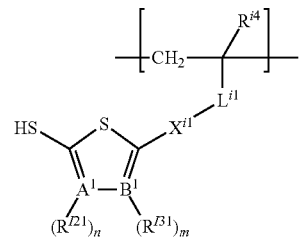

(IB)

$R^{i21}$ and $R^{i31}$ each independently represent a hydrogen atom, a C1-C10 aliphatic hydrocarbon group, a C3-C18 alicyclic hydrocarbon group, and a C6-C14 aromatic hydrocarbon group; $A^1$ and $B^1$ each independently represent a nitrogen atom or a carbon atom;

$R^{i4}$ represents a hydrogen atom or a methyl group;

$X^{i1}$ represents a sulfur atom and an imino group;

$L^{i1}$ represents a C1-C20 divalent hydrocarbon group where a methylene group can be replaced by an oxygen atom or a carbonyl group; and "n" and "m" each independently represent 0 or 1.

As to formula (IB), examples of the aliphatic hydrocarbon group, the alicyclic hydrocarbon group, and the aromatic hydrocarbon group for $R^{i21}$ and $R^{i31}$ include those as referred to for $R^{i2}$ and $R^{i3}$.

The aliphatic hydrocarbon group represented by $R^{i21}$ and $R^{i31}$ is preferably a C1-C4 alkyl group. The alicyclic hydrocarbon group represented by $R^{i21}$ and $R^{i31}$ is preferably a C5-C10 cycloalkyl group. The aromatic hydrocarbon group represented by $R^{i21}$ and $R^{i31}$ is preferably a C6-C10 aryl group. Each of $R^{i21}$ and $R^{i31}$ is preferably a hydrogen atom or a C1-C4 alkyl group.

It is preferred that one or both of $A^1$ and $B^1$ are nitrogen atoms, and it is more preferred that both of them are nitrogen atoms. $X^{i1}$ is preferably a sulfur atom.

Examples of the divalent hydrocarbon group represented by $L^{i1}$ include a C1-C20 alkanediyl group such as a methyl group, an ethylene group, propane-1,3-diyl group, butane-1,4-diyl group, pentane-1,5-diyl group, hexane-1,6-diyl group, heptane-1,7-diyl group, octane-1,8-diyl group, nonane-1,9-diyl group, decane-1,10-diyl group, undecane-1,11-diyl group, dodecane-1,12-diyl group, tridecane-1,13-diyl group, tetradecane-1,14-diyl group, pentadecane-1,15-diyl group, hexadecane-1,16-diyl group and heptadecane-1,17-diyl group, an ethane-1,1-diyl group, a propane-1,1-diyl group, a propane-1,2-diyl group, a propane-2,2-diyl group, a pentane-2,4-diyl group, a 2-methyl propane-1,3-diyl group, a 2-methyl propane-1,2-diyl group, a pentane-1,4-diyl group, and a 2-methyl butane-1,4-diyl group; divalent monocyclic alicyclic hydrocarbon group including a C3-C20 cycloalkanediyl group such as a cyclobutane-1,3-diyl group, a cyclopentane-1,3-diyl group, a cyclohexane-1,4-diyl group, and a cyclooctane-1,5-diyl group;

a C4-C20 divalent polycyclic alicyclic hydrocarbon group such as a norbornane-1,4-diyl group, a norbornane-2,5-diyl group, an adamantane-1,5-diyl group, and an adamantane-2,6-diyl group; a C6-C20 arylene group such as a phenylene group, a tolylene group and a naphthylene group.

$L^{i1}$ is preferably a C2-C20 alkanediyl group where a methylene group can be replaced by an oxygen atom or a carbonyl group, or a combination of a phenylene group with a C2-C11 alkanediyl group where a methylene group can be replaced by an oxygen atom or a carbonyl group.

Each of "n" and "m" is preferably 0. Generally, "n" represents 0 when A represents a nitrogen atom. "n" represents 1 when A represents a carbon atom. "m" represents 0 when B represents a nitrogen atom. "m" represents 1 when B represents a carbon atom.

The structural unit represented by formula (IB) is preferably one represented by formula (IB-1) or formula (IB-2).

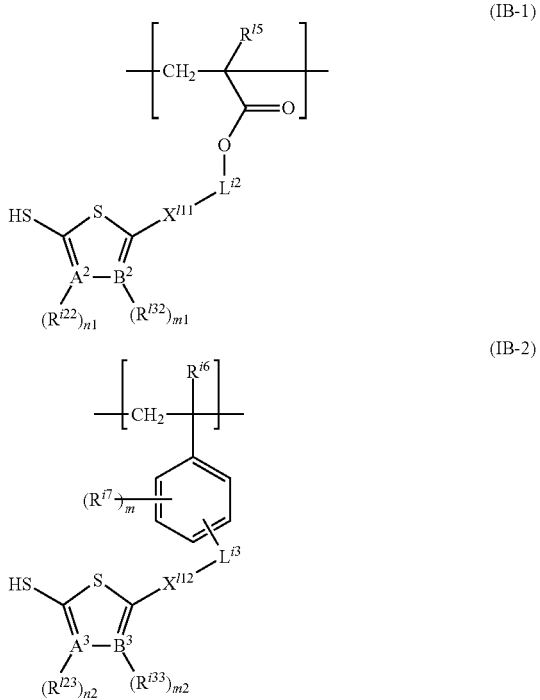

where $R^{i22}$, $R^{i32}$, $R^{i23}$ and R each independently represent a hydrogen atom, a C1-C10 aliphatic hydrocarbon group, a C3-C18 alicyclic hydrocarbon group, and a C6-C14 aromatic hydrocarbon group;
$A^2$, $B^2$, $A^3$ and $B^3$ each independently represent a nitrogen atom or a carbon atom;
$R^{i5}$ and $R^{i6}$ each independently represent a hydrogen atom or a methyl group;
$R^{i7}$ represents a C1-C6 alkyl group or a C1-C6 alkoxy group;
$X^{i11}$ and $X^{i12}$ each independently represent a sulfur atom and an imino group;
$L^{i2}$ represents a C1-C18 divalent saturated hydrocarbon group where a methylene group can be replaced by an oxygen atom or a carbonyl group;
$L^{i3}$ represents a C1-C14 divalent saturated hydrocarbon group where a methylene group can be replaced by an oxygen atom or a carbonyl group;
and "n1", "m1", "n2" and "m2" each independently represent 0 or 1.

Examples of $R^{i22}$, $R^{i32}$, $R^{i23}$ and $R^{i33}$ each independently include those of $R^{i21}$ and $R^{i31}$.

Examples of $L^{i2}$ include a C1-C18 alkanediyl group such as a methylene group, an ethylene group, a propane-1,3-diyl group, a butane-1,4-diyl group, a pentane-1,5-diyl group, a hexane-1,6-diyl group, a heptane-1,7-diyl group, an octane-1,8-diyl group, a nonane-1,9-diyl group, a decane-1,10-diyl group, an undecane-1,11-diyl group, a dodecane-1,12-diyl group, a tridecane-1,13-diyl group, a tetradecane-1,14-diyl group, a pentadecane-1,15-diyl group, a hexadecane-1,16-diyl group and a heptadecane-1,17-diyl group, an ethane-1,1-diyl group, a propane-1,1-diyl group, a propane-1,2-diyl group, a propane-2,2-diyl group, a pentane-2,4-diyl group, a 2-methylpropane-1,3-diyl group, a 2-methyl propane-1,2-diyl group, a pentane-1,4-diyl group, and a 2-methyl butane-1,4-diyl group;
a C3-C18 divalent monocyclic alicyclic hydrocarbon group including a C3-C18 cycloalkanediyl group such as a cyclobutane-1,3-diyl group, a cyclopentane-1,3-diyl group, a cyclohexane-1,4-diyl group, and a cyclooctane-1,5-diyl group; a C3-C18 divalent polycyclic alicyclic hydrocarbon group such as a norbornane-1,4-diyl group, a norbornane-2,5-diyl group, an adamantane-1,5-diyl group, and an adamantane-2,6-diyl group. $L^{i2}$ is preferably a C1-C18 alkanediyl group, more preferably a C1-C14 alkanediyl group, and still more preferably a C1-C11 alkanediyl group.

Examples of $L^{i3}$ include a C1-C14 alkanediyl group such as a methylene group, an ethylene group, a propane-1,3-diyl group, a butane-1,4-diyl group, a pentane-1,5-diyl group, a hexane-1,6-diyl group, a heptane-1,7-diyl group, an octane-1,8-diyl group, a nonane-1,9-diyl group, a decane-1,10-diyl group, an undecane-1,11-diyl group, a dodecane-1,12-diyl group, a tridecane-1,13-diyl group, a tetradecane-1,14-diyl group, an ethane-1,1-diyl group, a propane-1,1-diyl group, a propane-1,2-diyl group, a propane-2,2-diyl group, a pentane-2,4-diyl group, a 2-methylpropane-1,3-diyl group, a 2-methyl propane-1,2-diyl group, a pentane-1,4-diyl group, and a 2-methyl butane-1,4-diyl group;
a C3-C14 divalent monocyclic alicyclic hydrocarbon group including a C3-C14 cycloalkanediyl group such as a cyclobutane-1,3-diyl group, a cyclopentane-1,3-diyl group, a cyclohexane-1,4-diyl group, and a cyclooctane-1,5-diyl group; a C3-C14 divalent polycyclic alicyclic hydrocarbon group such as a norbornane-1,4-diyl group, a norbornane-2,5-diyl group, an adamantane-1,5-diyl group, and an adamantane-2,6-diyl group. $L^{i3}$ is preferably a C1-C14 alkanediyl group, and still more preferably a C1-C11 alkanediyl group.

$L^{i3}$ is preferably attached to a phenylene group so as to form a para-phenylene group.

Specific examples of Compound (I) include compounds represented by formulae (I-1) to (I-26), a polymer which comprises a structural unit represented by any one of formulae (I-27) to (I-38) and a polymer which comprises structural units represented by any one of formulae (I-39) to (I-48).

(I-1)

(I-2)

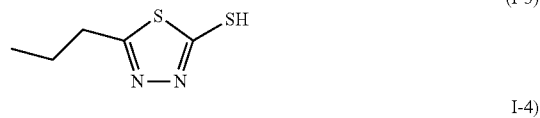

(I-3)

I-4)

(I-5)

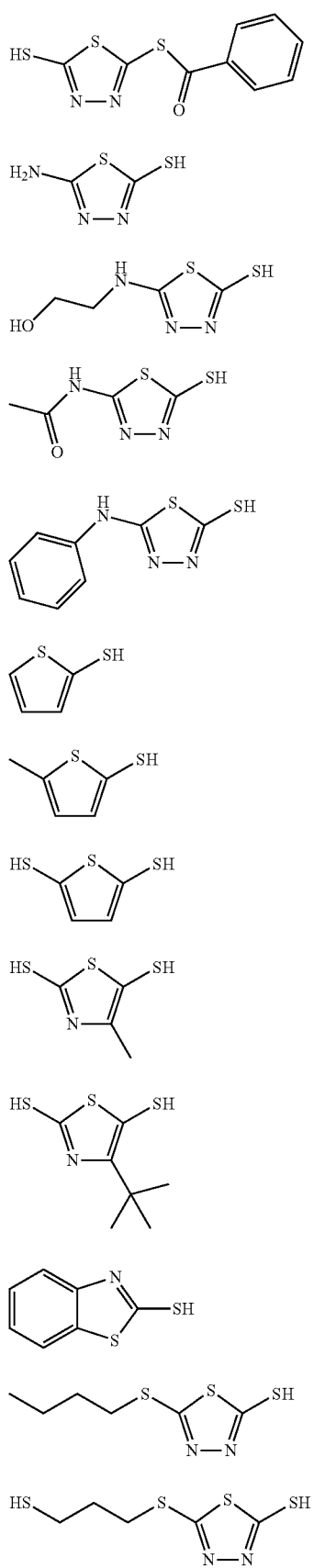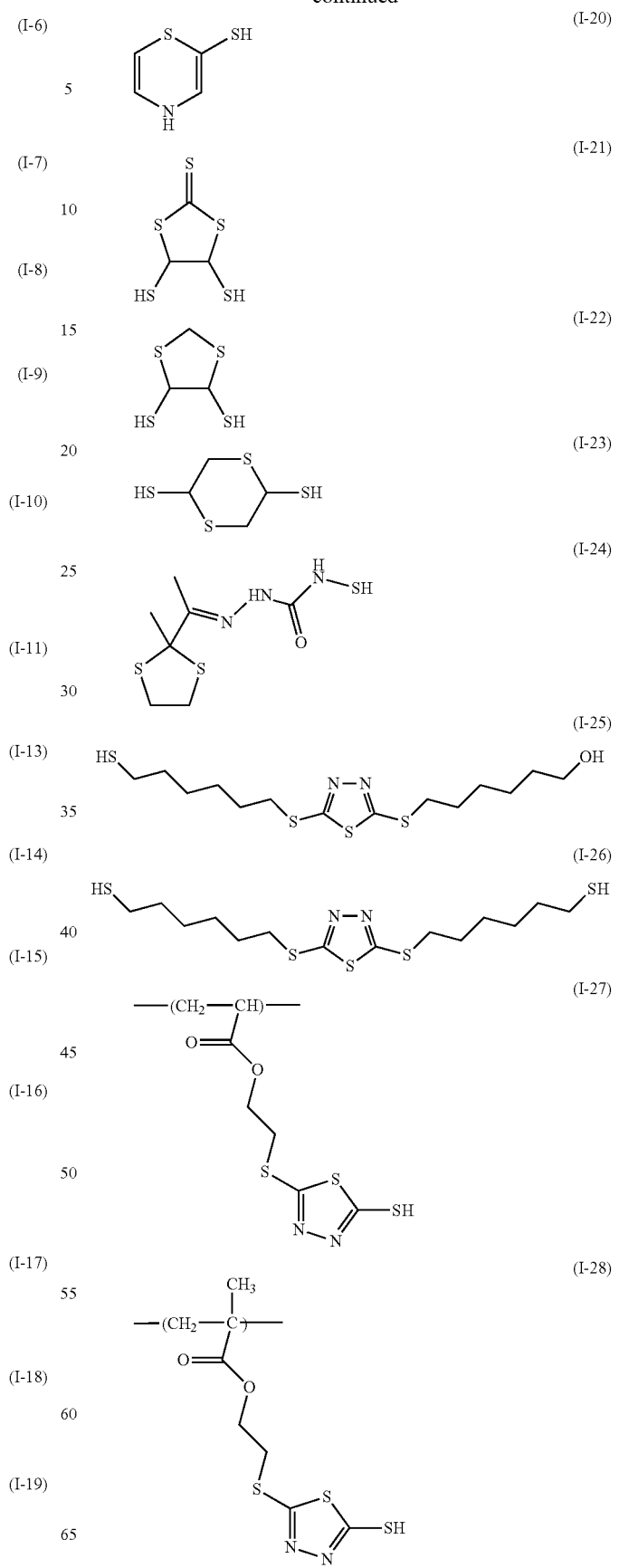

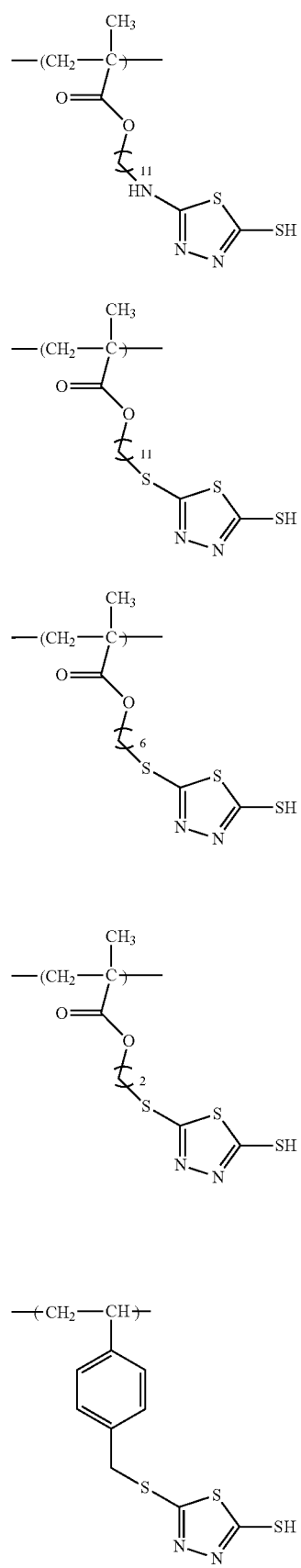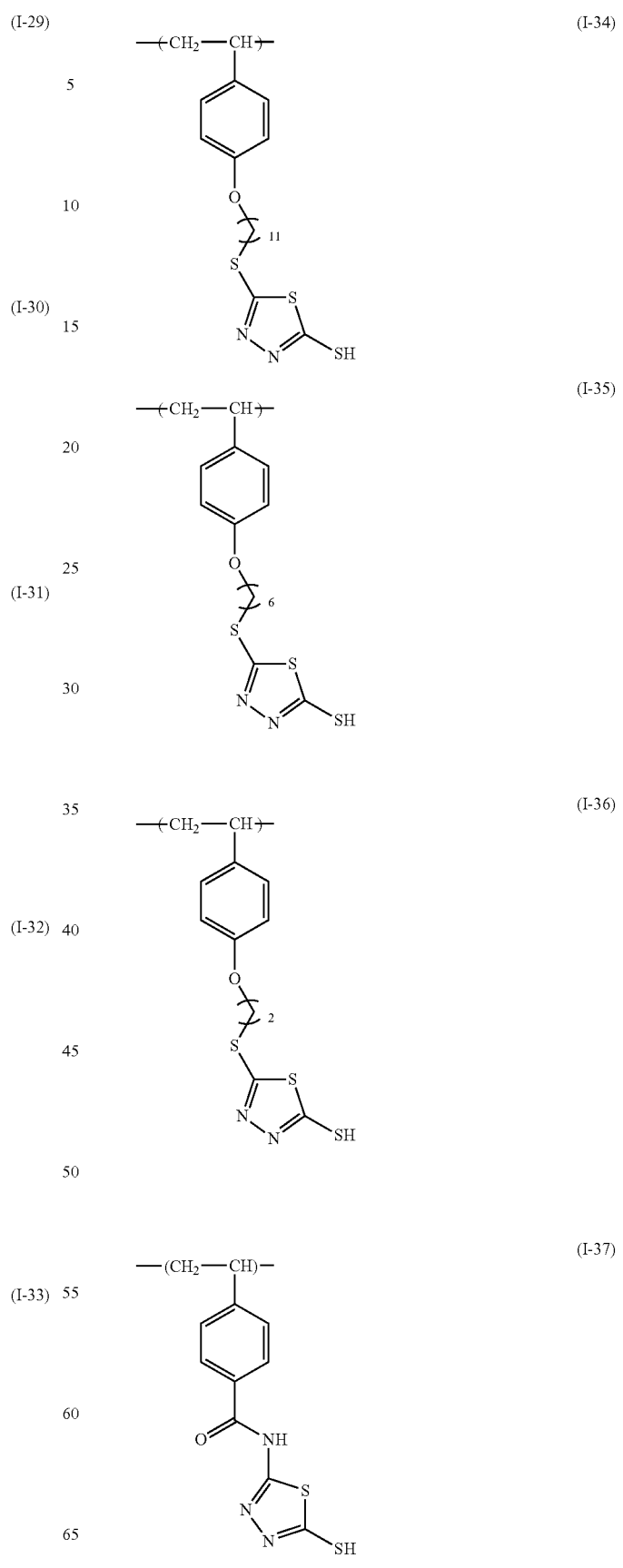

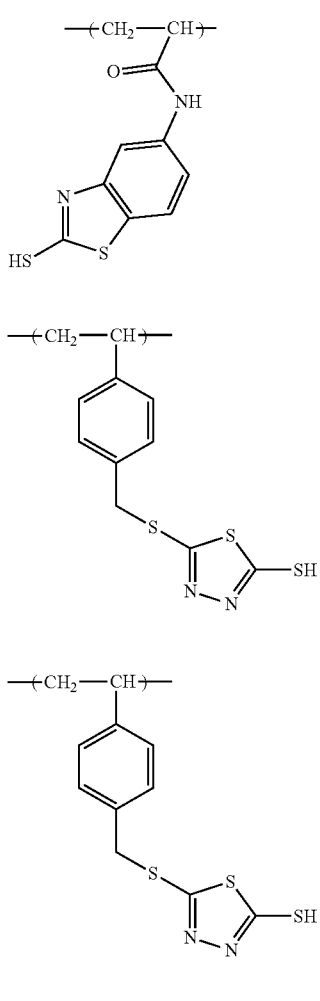
(I-38)
(I-39)
(I-40)
(I-41)
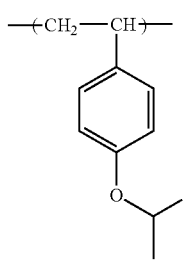
(I-42)
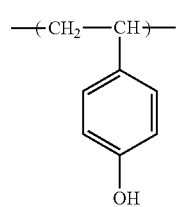
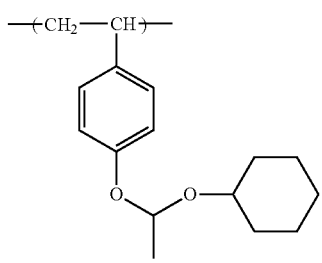
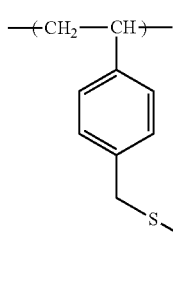
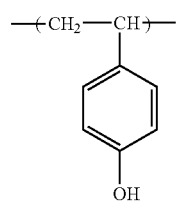
(I-43)
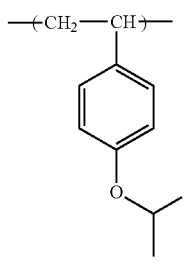

(I-44)
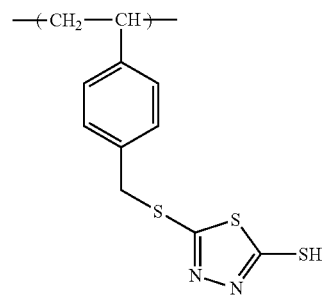

(I-45)
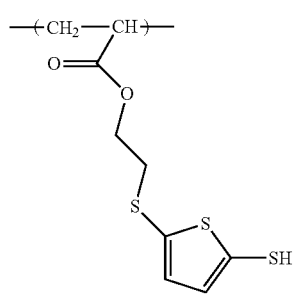

(I-46)
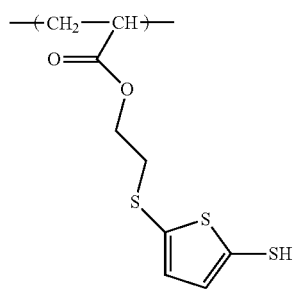

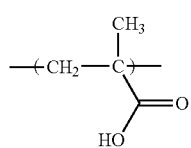

(I-47)
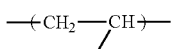 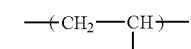
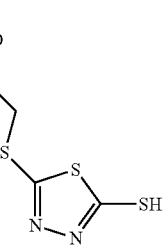

(I-48)
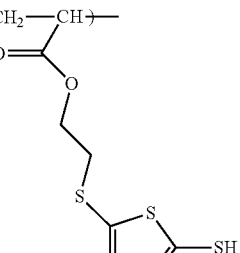

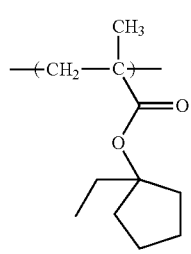

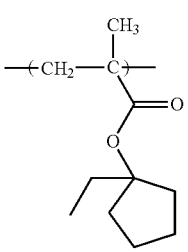

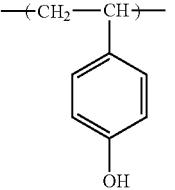

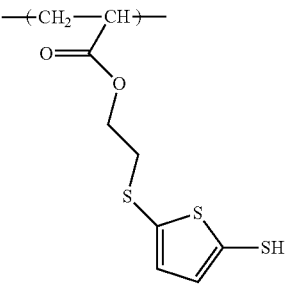

Among the compounds represented by formulae (I-1) to (I-26), those represented by formulae (I-1) to (I-13) are preferred, and those represented by formulae (I-1), (I-4) and (I-11) are more preferred.

Among the polymers which comprises a structural unit represented by any one of formulae (I-27) to (I-38), those which comprises a structural unit represented by any one of formulae (I-27) to (I-36) are preferred, those which comprises a structural unit represented by any one of formulae (I-27), (I-28), (I-32) and (I-33) are more preferred, and one represented by formula (I-33) is still more preferred.

Among polymers represented by formulae (I-39) to (I-48), those represented by formulae (I-39) to (I-44) are preferred, and those represented by formulae (I-39) to (I-42) are more preferred.

Compound (I) can be prepared according to the methods as mentioned in JP2010-79081A1 or JP2010-75277A1, which is available on the market.

The content of Compound (I) in the photoresist composition is preferably 0.01% by mass or more, and preferably 0.02% by mass or less, of the total amount of solid components.

The content of Compound (I) is preferably 20% by mass or less, more preferably 10% by mass or less, still more preferably 4% by mass or less, further more preferably 3% by mass or less, of the total amount of solid components.

In this specification, "solid components" means components other than solvent in the photoresist composition.

<Resin (A1)>

The photoresist composition comprises a resin which has an acid-labile group, which resin is sometimes referred to as "Resin (A1)".

Herein, the "acid-labile group" means a group capable of being eliminated by the action of an acid to form a hydrophilic group such as a hydroxyl group or carboxy group.

Here, the structural unit which has an acid-labile group is sometimes referred to as "structural unit (a1)".

Examples of the acid-labile group include a group represented by the formula (1) or the formula (2):

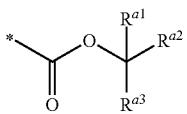
(1)

wherein $R^{a1}$, $R^{a2}$ and $R^{a3}$ independently each represent a C1-C8 alkyl group or a C3-C20 alicyclic hydrocarbon group, or two of $R^{a1}$, $R^{a2}$ and $R^{a3}$ are bonded each other to form a C2-C20 divalent hydrocarbon group and the other is a C1-C8 alkyl group or a C3-C20 alicyclic hydrocarbon group, and * represents a binding position.

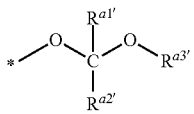
(2)

wherein $R^{a1'}$ and $R^{a2'}$ independently each represent a hydrogen atom or a C1-C12 hydrocarbon group where a methylene group can be replaced by an oxygen atom or a sulfur atom, and $R^{a3'}$ represents a C1-C20 hydrocarbon group where a methylene group can be replaced by an oxygen atom or a sulfur atom,
or one of $R^{a1'}$ and $R^{a2'}$ represents a hydrogen atom or a C1-C12 hydrocarbon group where a methylene group can be replaced by an oxygen atom or a sulfur atom, and the other is bonded to $R^{a3'}$ to form a C2-C20 divalent hydrocarbon group where a methylene group can be replaced by an oxygen atom or a sulfur atom, and * represents a binding position.

Specific examples of the C1-C8 alkyl group represented by $R^{a1}$, $R^{a2}$ and $R^{a3}$ include a methyl group, an ethyl group, a propyl group, an isopropyl group, a butyl group, a pentyl group, a hexyl group, a heptyl group and an octyl group.

The alicyclic hydrocarbon group represented by $R^{a1}$, $R^{a2}$ and $R^{a3}$ may be monocyclic or polycyclic. Examples of the alicyclic hydrocarbon group include a monocyclic alicyclic hydrocarbon group such as a C3-C20 cycloalkyl group (e.g. a cyclopentyl group, a cyclohexyl group, a cycloheptyl group and a cyclooctyl group) and a polycyclic alicyclic hydrocarbon group such as a decahydronaphthyl group, an adamantyl group, a norbornyl group, and the followings:

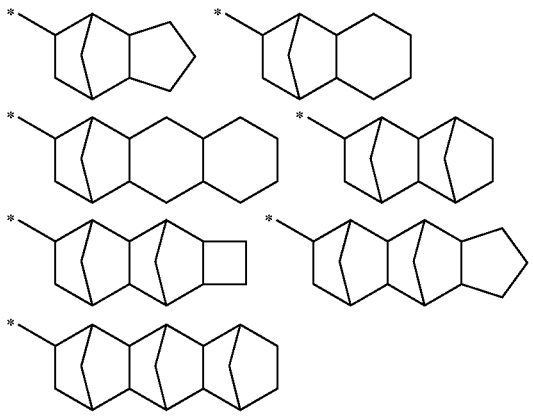

wherein * represents a binding position.

The alicyclic hydrocarbon group preferably has 3 to 16 carbon atoms.

When $R^{a1}$ and $R^{a2}$ are bonded to each other to form the divalent hydrocarbon group, examples of the group represented by $—C(R^{a1})(R^{a2})(R^{a3})$ include the following groups and the divalent hydrocarbon group preferably has 3 to 12 carbon atoms.

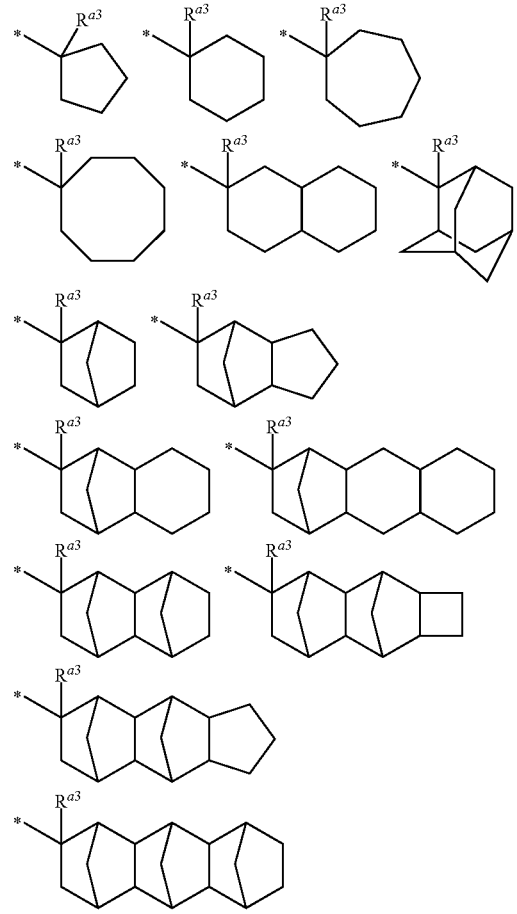

wherein $R^{a3}$ is the same as defined above, and * represents a binding position.

As the group represented by the formula (1), preferred are 1,1-dialkylalkoxycarbonyl group, i.e. the group represented by the formula (1) wherein $R^{a1}$, $R^{a2}$ and $R^{a3}$ independently each represent a C1-C8 alkyl group, preferably a tert-butyl group; a 2-alkyladamantane-2-yloxycarbonyl group, i.e., the group represented by the formula (1) wherein $R^{a1}$ and $R^{a2}$ are bonded each other to form an adamantane ring and $R^{a3}$ is a C1-C8 alkyl group; and 1-(adaman-1-tyl)-1-alkylalkoxycarbonyl group, i.e., the group represented by the formula (1) wherein $R^{a1}$ and $R^{a2}$ are C1-C8 alkyl groups and $R^{a3}$ is an adamantyl group.

Examples of the hydrocarbon group represented by $R^{a1'}$, $R^{a2'}$ and $R^{a3'}$ include an alkyl group, an alicyclic hydrocarbon group, an aromatic hydrocarbon group and a combined structure of them.

Examples of the alkyl group and the alicyclic hydrocarbon group include the same as described above.

Examples of the aromatic hydrocarbon group include an aryl group such as a phenyl group, a naphthyl group, an anthryl group, a p-methylphenyl group, a p-tert-butylphenyl group, a p-adamantylphenyl group, a tolyl group, a xylyl group, a cumyl group, a mesityl group, a biphenyl group, a phenanthryl group, a 2,6-diethylphenyl group and a 2-methyl-6-ethylphenyl group.

The group formed by combining an alkyl group and an alicyclic hydrocarbon group includes methylcyclohexyl group, dimethylcyclohexyl group, methylnorbornyl group, isobornyl group and 2-alkyladamantane-2-yl group, a 1-(adamantane-1-yl)alkane-1-yl group.

The group formed by combining an alkyl group and an aromatic hydrocarbon group includes an aralkyl group, specifically benzyl group, a phenethyl group, a phenylpropyl group, a trityl group, naphthylmethyl group and naphthylethyl group.

When $R^{a1'}$ and $R^{a2'}$ are bonded to each other to form a divalent hydrocarbon group, the divalent hydrocarbon group includes a group in which one hydrogen atom has been removed from the hydrocarbon group represented by $R^{a1'}$, $R^{a2'}$ and $R^{a3'}$.

It is preferred that at least one of $R^{a1'}$ and $R^{a2'}$ is a hydrogen atom.

Examples of the group represented by the formula (2) include the following.

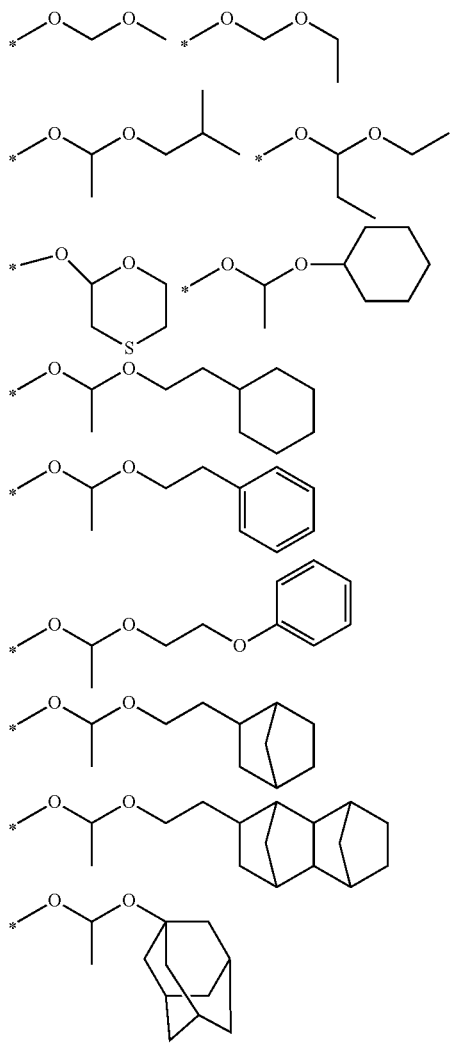

-continued

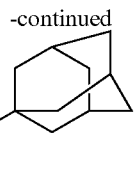

wherein * represents a binding position.

Resin (A1) is preferably a resin has a group represented by formula (1) or (2).

The monomer from which a structural unit having an acid-labile group is derived is preferably a monomer having an acid-labile group in its side chain and a carbon-carbon double bond, and is more preferably a (meth)acrylate monomer having the group represented by formula (1) in its side chain and still more preferably a (meth)acrylate monomer having a group represented by formula (1) or (2) in its side chain.

Resin (A1) may comprise one or more structural units (a1). Preferable examples of the structural units (a1) include the structural units represented by the formulae (a1-1) and (a1-2):

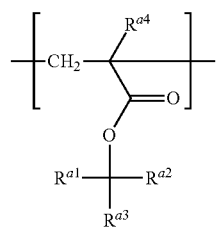

(a1-1)

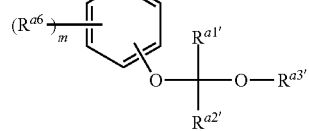

(a1-2)

In each formula, $R^{a1}$, $R^{a2}$, $R^{a3}$, $R^{a1'}$, $R^{a2'}$ and $R^{a3'}$ are the same meanings as above,
$R^{a4}$ and $R^{a5}$ each independently represent a hydrogen atom or a methyl group,
$R^{a6}$ represents a C1-C8 alkyl group or a C1-C8 alkoxy group, and m represents an integer of 0 to 4.

In formula (a1-1), examples of $R^{a1}$, $R^{a2}$ and $R^{a3}$ include the same as referred for those in formula (1). Preferred $R^{a1}$, $R^{a2}$ and $R^{a3}$ are the same as referred for those in formula (1).

In formula (a1-2), $R^{a1'}$ is preferably a hydrogen atom.

$R^{a2'}$ is preferably a C1-C12 hydrocarbon group, more preferably a C1-C12 alkyl group, and still more preferably a methyl group and an ethyl group.

The hydrocarbon group for $R^{a3'}$ includes preferably a C1-C18 alkyl group, a C3-C18 alicyclic hydrocarbon group, a C6-C18 aromatic hydrocarbon group, and a combined group of them, more preferably a C1-C18 alkyl group, a C3-C18 alicyclic hydrocarbon group, and C7-C18 aralkyl group. The alkyl group and the alicyclic hydrocarbon group are preferably unsubstituted. When the aromatic hydrocarbon group has been substituted, the substituent is a C6-C10 aryloxy group.

$R^{a5}$ is preferably a hydrogen atom.
$R^{a6}$ is preferably a C1-C4 alkoxy group, and more preferably a methoxy and ethoxy group, and still more preferably methoxy group.
m is preferably 0 or 1, and more preferably 0.
Examples of the structural unit represented by formula (a1-1) include those represented by formulae (a1-1-1) to (a1-1-17).
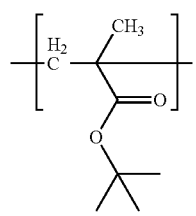
(a1-1-1)
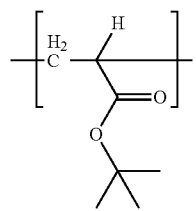
(a1-1-2)
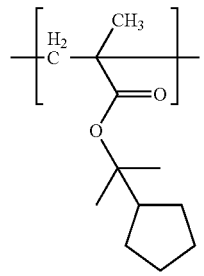
(a1-1-3)
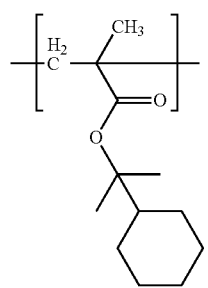
(a1-1-4)
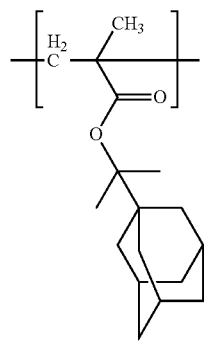
(a1-1-5)
-continued
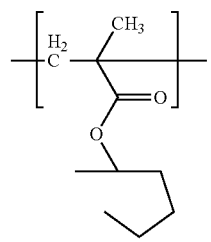
(a1-1-6)
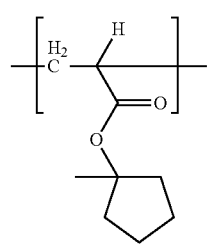
(a1-1-7)
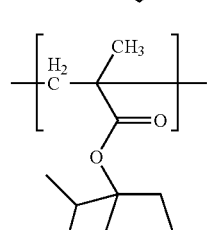
(a1-1-8)
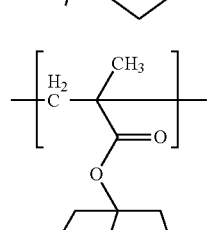
(a1-1-9)
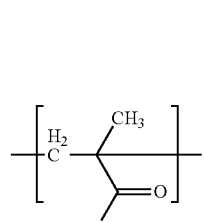
(a1-1-10)
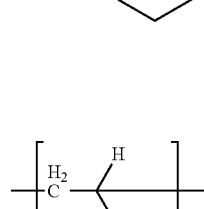
(a1-1-11)
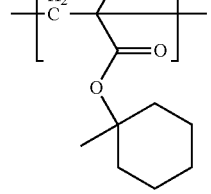

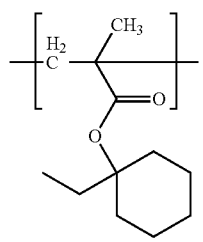
(a1-1-12)
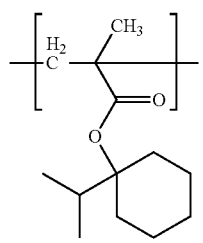
(a1-1-13)
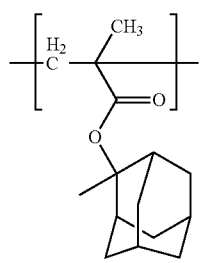
(a1-1-14)
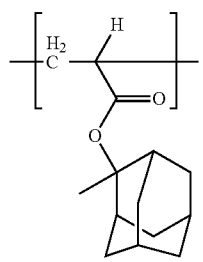
(a1-1-15)
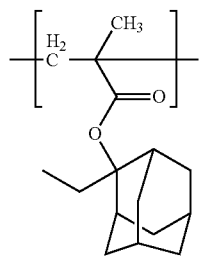
(a1-1-16)
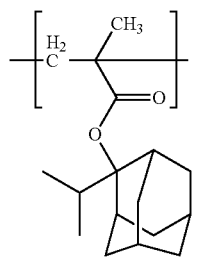
(a1-1-17)
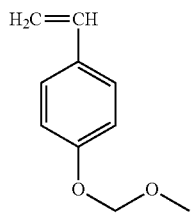
(a1-2-1)
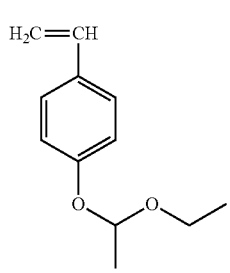
(a1-2-2)
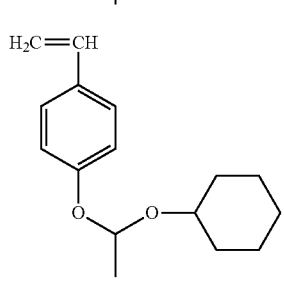
(a1-2-3)
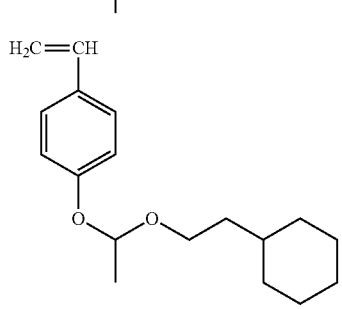
(a1-2-4)
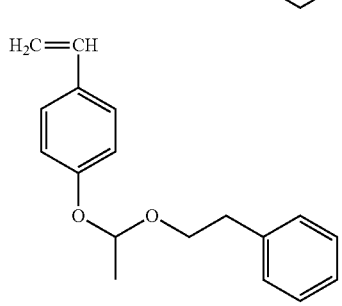
(a1-2-5)
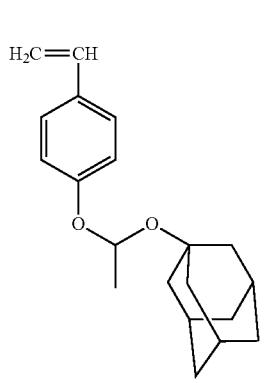
(a1-2-6)
Examples of the structural unit represented by formula (a1-2) include those derived from the monomer represented by any one of formulae (a1-2-1) to (a1-2-8).

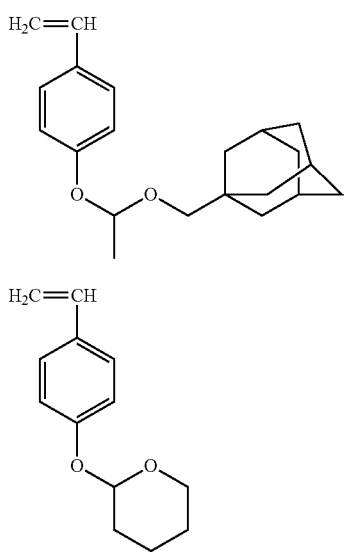

(a1-2-7)

(a1-2-8)

When Resin (A1) comprises the structural unit represented by formula (a1-1) and/or formula (a1-2), the total content of these structural units is usually 10 to 95% by mole and preferably 15 to 90% by mole, more preferably 25 to 85% by mole, and still more preferably 20 to 60% by mole based on total molar of all the structural units of the resin.

The resin preferably may comprise a structural unit having no acid-labile group, in addition to the structural unit having an acid-labile group. Resin (A1) is different from Polymer (I) in that the former which comprises no structural unit having a sulfide bond and a mercapto group at a side chain. The resin can comprise two or more kinds of structural units having no acid-labile group. The structural unit having no acid-labile group preferably has a hydroxyl group or a lactone ring. When the resin comprises the structural unit having no acid-labile group, the content ratio of the structural unit having an acid-labile group to the structural unit having no acid-labile group, i.e., [the structural unit having an acid-labile group]:[the structural unit having no acid-labile group] is preferably 10:90 to 80:20, more preferably 20:80 to 60:40, on the molar base.

Examples of the structural unit having no acid-labile group include those represented by formulae (a2-1), (a2-2) and (a2-3).

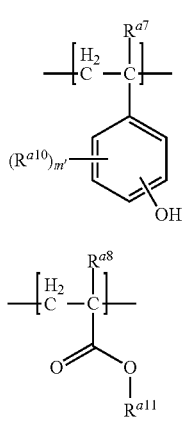

(a2-1)

(a2-2)

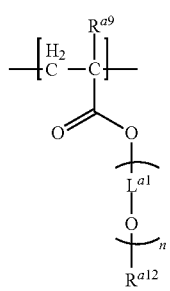

(a2-3)

wherein $R^{a7}$, $R^{a8}$ and $R^{a9}$ independently represent a hydrogen atom or a methyl group,
$R^{a10}$ represents a C1-C6 alkyl group or a C1-C6 alkoxy group,
m' represents an integer of 0 to 4,
$R^{a11}$ represents a C1-C10 primary or secondary hydrocarbon group,
$R^{a12}$ represents a C1-C6 alkyl group,
$L^{a1}$ represents a C1-C6 monovalent alkanediyl group where the carbon atom at the first or second position is bonded to an oxygen atom, and
n represents an integer of 1 to 30.

Examples of the alkyl group in formulae (a2-1), (a2-2) and (a2-3) include a methyl group, an ethyl group, a propyl group, a butyl group, a pentyl group and a hexyl group.

Examples of the alkoxy group include a methoxy group, an ethoxy group, a propoxy group, a butoxy group, a pentyloxy group and a hexyloxy group.

Examples of the alkanediyl group include linear alkanediyl groups such as methylene group, ethylene group, propane-1,3-diyl group, butane-1,4-diyl group, pentane-1,5-diyl group, and hexane-1,6-diyl group; and branched alkanediyl groups such as a propane-1,2-diyl group, a pentane-1,4-diyl group, and a 2-methylbutane-1,4-diyl group. The hydrocarbon group represented by $R^{a11}$ includes a C1-C10 alkyl group such as a methyl group, an ethyl group, a propyl group, a butyl group, a pentyl group, a hexyl group, a heptyl group, and an octyl group; a C3-C10 cycloalkyl group such as a cyclopentyl group, a cyclohexyl group, a cycloheptyl group; a C6-C10 aromatic hydrocarbon group such as a phenyl group, a naphtyl group; and a C7-C10 aralkyl group such as benzyl group.

$R^{a7}$ preferably represents a hydrogen atom.
$R^{a10}$ represents preferably a C1-C4 alkoxy group, more preferably a methoxy group or an ethoxy group, and still more preferably a methoxy group.

m' represents preferably an integer of 0 or 1, more preferably an integer of 0.

$R^{a11}$ represents preferably a C1-C6 primary or secondary alkyl group.

$L^{a1}$ represents preferably a C2-C4 alkanediyl group such as an ethane-1,2-diyl group, a propane-1,3-diyl group and a butane-1,2-diyl group, more preferably an ethane-1,2-diyl group.

n represents preferably an integer of 1 to 10.

Examples of the structural unit represented by formula (a2-1) include those represented by formulae (a2-1-1), (a2-1-2), (a2-1-3) and (a2-1-4).

The monomers from which the structural units represented by formula (a2-1) are derived are mentioned in JP2010-204634A1.

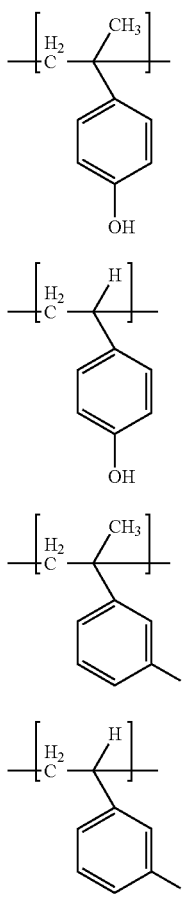

(a2-1-1)

(a2-1-2)

(a2-1-3)

(a2-1-4)

Examples of the monomers from which the structural units represented by formula (a2-2) are derived include alkyl(meth)acrylates such as methyl(meth)acrylate, ethyl (meth)acrylate, propyl(meth)acrylate, butyl(meth)acrylate, hexyl(meth)acrylate, cycloalkyl(meth)acrylates such as cyclopentyl(meth)acrylate and cyclohexyl(meth)acrylate, polycyclic(meth)acrylates such as adamantyl(meth)acrylate, and aryl(meth)acrylates such as phenyl(meth)acrylate and aralkyl(meth)acrylates such as benzyl(meth)acrylate. Herein, "(meth)acrylate" includes acrylate and methacrylate. Examples of the monomers from which the structural units represented by formula (a2-3) are derived include (meth)acrylates such as ethyleneglycolmonomethylether(meth)acrylate, ethyleneglycolmonoethylether(meth)acrylate, ethyleneglycolmonopropylethylether(meth)acrylate, ethyleneglycolmonobuthylether(meth)acrylate, diethyleneglycolmonomethylether(meth)acrylate, triethyleneglycolmonomethylether(meth)acrylate, tetraethyleneglycolmonomethylether(meth)acrylate, pentaethyleneglycolmonomethylether(meth)acrylate, hexaethyleneglycolmonomethylether(meth)acrylate, nonaethyleneglycolmonomethylether(meth)acrylate, and octaethyleneglycolmonomethylether(meth)acrylate.

Other examples of the monomers from which the structural unit having no acid-labile group is derived include acrylate, methacrylate, crotonic acid, 2-hydroxyethyl(meth) acrylate, 2-hydroxypropyl(meth)acrylate, styrene, α-methylstyrene, 4-methylstyrene, 2-methylstyrene, 3-methylstyrene, 4-methoxystyrene, and 4-isopropoxystyrene.

Examples of Resin (A1) include what comprises the combinations of structural units, as represented by the following formulae (A1-1) to (A1-19).

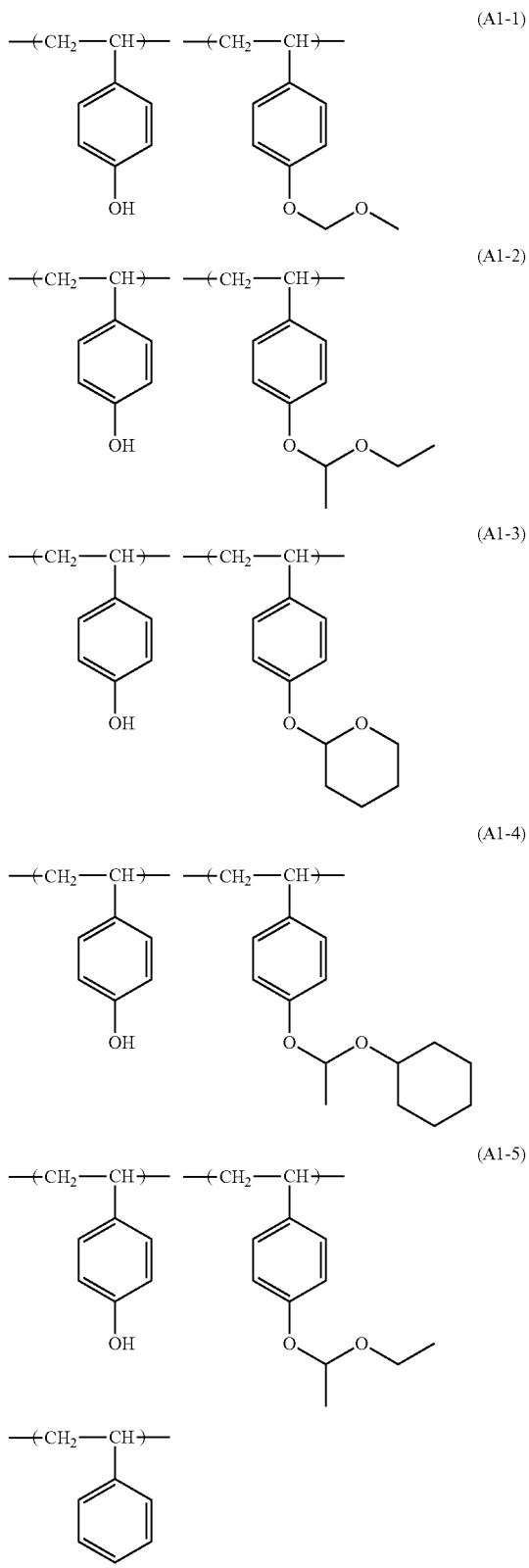

-continued

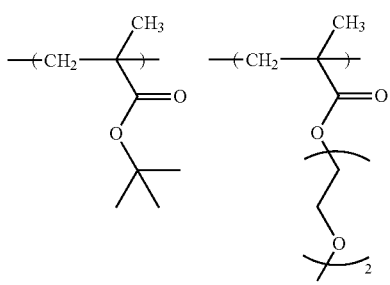
(A1-15)

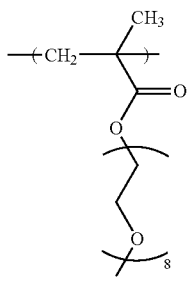

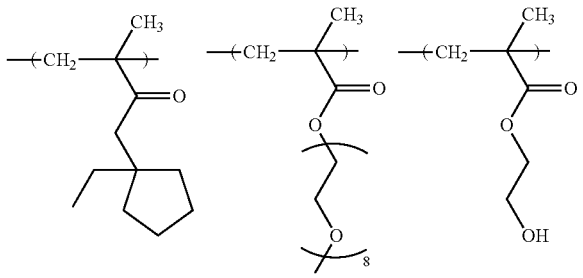
(A1-16)

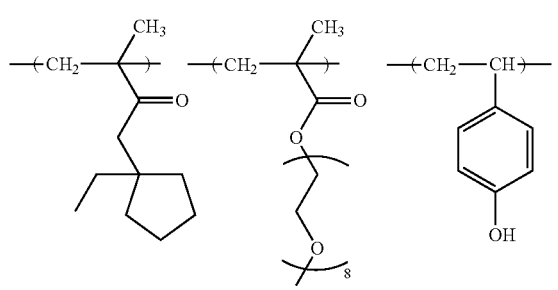
(A1-17)

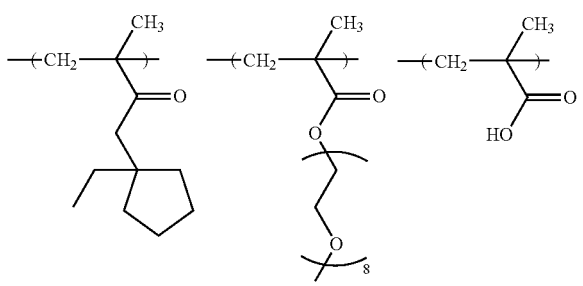
(A1-18)

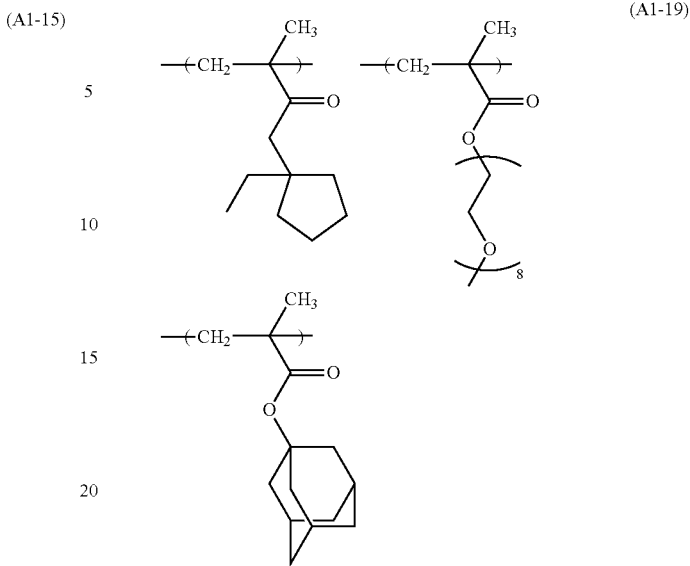
(A1-19)

The Resin (A1) preferably comprises the structural unit represented by formula (a1) and the structural unit having no acid-labile group, more preferably the structural unit represented by formula (a1-1) and/or formula (a1-2) as well as the structural unit having no acid-labile group.

Resin (A1) can be produced by polymerizing the above-mentioned monomers in a known manner such as radical polymerization.

As Resin (A1), can be used a resin obtained by reacting a resin which has one or both of a carboxy group and a phenolic hydroxyl group at a side chain with a compound which has at least two vinyloxy groups. Here, such resin is sometimes referred to as "Resin (A1b)". Resin (A1b) is preferably one obtained by reacting a resin which has a phenolic hydroxyl group at a side chain with a compound which has at least two vinyloxy groups.

Such resin can be produced by polymerizing a monomer from which the structural unit represented by formula (a1-2) and/or formula (a2-1) is derived, and further reacting the obtained polymer with a novolak resin and a compound having at least two vinyloxy groups.

The novolak resin is described later. Examples of the compound having at least two vinyloxy groups include 1,4-cyclohexanedimethanoldivinylether, and ethyleneglycoldivinylether.

The amount ratio of the polymer obtained by the first polymerization with the novolak resin is preferably from 30:70 to 70:30 by mass basis.

In the optional reaction, the amount of the compound having at least two vinyloxy groups is preferably in the range of 1 to 30 parts, more preferably in the range of 2 to 10 parts per 100 parts of the total polymers to be used.

More specific procedure of the optional reaction is described in JP2008-134515A1, JP 2008-46594A1 or the like.

The average weight molecule weight of Resin (A1) is preferably 5000 or more, more preferably 1000 or more, still more preferably 15000 or more, and 600000 or less, more preferably 500000 or less.

The weight average molecular weight of Resin (Ab1) is preferably 5000 or more, more preferably 10,000 or more, and preferably 300,000 or less, more preferably 200,000 or less.

Herein, the weight-average molecular weight can be determined by gel permeation chromatography using standard polystyrene as a standard reference material. The specific condition for the chromatography is described in Examples of the present application.

The photoresist composition of the present invention may further comprise another resin than Resin (A1). Here, this another resin is sometimes referred to as "Resin (A2)".

Resin (A2) is preferably an alkaline-soluble resin. The alkaline-soluble resin means a resin which comprises an acid group and soluble in an alkaline developer. The acid group includes a carboxy group, a sulfo group, or a phenolic-hydroxy group.

The alkaline-soluble resin includes known resins in the art such as novolak resins and resins which comprises, not a structural unit (a1), but the structural unit (a2-1). As the alkaline-soluble resin, a novolak resin is preferred.

The novolak resin is a resin obtained by condensing a phenol compound with an aldehyde in the presence of a catalyst. Examples of the phenolic compound include phenol, o-, m- or p-cresol, 2,3-, 2,5-, 3,4- or 3,5-xylenol, 2,3,5-trimethylphenol, 2-, 3- or 4-tert-butylphenol, 2-tert-butyl-4- or 5-methylphenol, 2-, 4- or 5-methylresorcinol, 2-, 3- or 4-methoxyphenol, 2,3-, 2,5- or 3,5-dimethoxyphenol, 2-methoxyresorcinol, 4-t-butylcatechol, 2-, 3- or 4-ethylphenol, 2,5- or 3,5-diethylphenol, 2,3,5-triethylphenyl, 2-naphthol, 1,3-, 1,5- or 1,7-dihydroxynaphthalene, and polyhydroxytriphenylmethane compounds obtained by condensing xylenol with hydroxybenzaldehyde. One or more of these phenolic compounds can be used for producing the other resin.

Among them, the phenolic compound is preferably o-cresol, m-cresol, p-cresol, 2,3-xylenol, 2,5-xylenol, 3,4-xylenol, 3,5-xylenol, 2,3,5-trimethylphenol, 2-t-butylphenol, 3-t-butylphenol, 4-t-butylphenol, 2-t-butyl-4-methylphenol or 2-t-butyl-5-methylphenol.

Examples of the aldehyde include aliphatic aldehydes such as formaldehyde, acetaldehyde, propionaldehyde, n-butyraldehyde, isobutyraldehyde, acrolein or croton aldehyde; alicyclic aldehydes such as cyclohexanealdehyde, cyclopentanealdehyde, furfural, and furanacrolein; aromatic aldehydes such as benzaldehyde, o-, m- or p-methylbenzaldehyde, p-ethylbenzaldehyde, 2,4-, 2,5-, 3,4- or 3,5-dimethylbenzaldehyde or o-, m- or p-hydroxybenzaldehyde; and aromatic aliphatic aldehydes such as phenylacetaldehyde or cinnamaldehyde.

One or more of these aldehydes can be used for producing the other resin. Among them, formaldehyde is preferred in view of easy industrial availability.

The catalyst for condensation of a phenolic compound and an aldehyde includes inorganic acids such as hydrochloric acid, sulfuric acid, perchloric acid or phosphoric acid; organic acid such as formic acid, acetic acid, oxalic acid, trichloroacetic acid or p-toluenesulfonic acid; divalent metal salts such as zinc acetate, zinc chloride or acetic acid magnesium.

One or more of these catalysts can be used for producing the other resin. The amount of the catalyst to be used is usually from 0.01 to 1 mole per mole of aldehyde.

The condensation of a phenolic compound and an aldehyde can be conducted in a known manner. The condensation can be conducted by mixing a phenolic compound and an aldehyde, followed by reacting them at the temperature in the range of 60° C. to 120° C. for 2 to 30 hours. The condensation can be conducted in the presence of a solvent such as methylethylketone, methylisobuthylketone and acetone.

After the reaction, novolak resins can be collected by adding a solvent insoluble in water to the reaction mixture, washing the mixture with water, followed by condensing it.

The content of the resin in the photoresist composition of the present invention is preferably 80% by mass or more, and preferably 99% by mass or less, of the total amount of solid components.

In this specification, "solid components" means components other than solvent in the photoresist composition.

The content of resin (A1) is preferably 10% to 100% by mass, more preferably 15% to 100% by mass, of the total amount of the resin.

The photoresist composition of the present invention comprises an acid generator.

The acid generator is a compound which can be decomposed by light or radiation to generate an acid. The acid generators may be either ionic or non-ionic one. The acid generator can be used singly or as a mixture of two or more thereof. The non-ionic acid generator includes organic halide, sulfonate esters (e.g., 2-nitrobenzoate, aromatic sulfonate, oxime sulfonate, N-sulfonyloxyimide, N-sulfonyloxyimide, sulfonyl oxyketone, diazonaphthoquinone 4-sulfonate) and sulfone (e.g., disulfone, ketosulfone, sulfonyldiazomethane). The ionic acid generator includes an onium salt comprising an onium cation (e.g., adiazonium salt, a phosphonium salt, a sulfonium salt, an iodonium salt). Anions of the onium salts include a sulfonic acid anion, a sulfonylimide anion and a sulfonylmethide anion.

The acid generator includes compounds which generate an acid upon radiation, which are described in JP63-26653A1, JP 55-164824A1, JP62-69263A1, JP63-146038A1, JP63-163452A1, JP 62-153853A1, JP63-146029A1, U.S. Pat. Nos. 3,779,778, 3,849,137, German patent No. 3914407 and European patent No. 126712.

The non-ionic acid generator is preferably a compound which comprises a group represented by formula (B1).

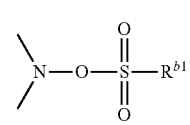

where $R^{b1}$ represents a C1-C18 hydrocarbon group which optionally has a fluorine atom and in which a methylene group optionally has been replaced by an oxygen atom or a carbonyl group.

The hydrocarbon group represented by $R^{b1}$ includes C1-C18 alkyl groups such as a methyl group, an ethyl group, a propyl group, an isopropyl group, a butyl group, a pentyl group, a hexyl group, a heptyl group, an octyl group, decyl group or dodecyl group, C3-C18 alicyclic hydrocarbon groups such as a monocyclic alicyclic hydrocarbon group such as a C3-C18 cycloalkyl group (e.g. a cyclopentyl group, a cyclohexyl group, a methylcyclohexyl group, a dimethylcyclohexyl group, a cycloheptyl group and a cyclooctyl group) and a polycyclic alicyclic hydrocarbon group (e.g. a decahydronaphthyl group, an adamantyl group, a norbornyl group), C6-C18 aromatic hydrocarbon groups such as a phenyl group, a naphthyl group, a p-methylphenyl group, a p-tert-butylphenyl group, a p-adamantylphenyl group, a tolyl group, a xylyl group, a cumyl group, a mesityl group, a biphenyl group, a phenanthryl group, a 2,6-diethylphenyl group and a 2-methyl-6-ethylphenyl group and other groups such as aralkyl groups.

The hydrocarbon group is preferably a C1-C10 alkyl group and a C6-C10 aromatic hydrocarbon group, and more preferably a C1-C8 alkyl group, and still more preferably a C1-C4 alkyl group.

The hydrocarbon group in which a methylene group has been replaced by an oxygen atom or a carbonyl group includes those represented by formulae (Y1) to (Y12), preferably those represented by formulae (Y7) to (Y9), more preferably one represented by formula (Y9):

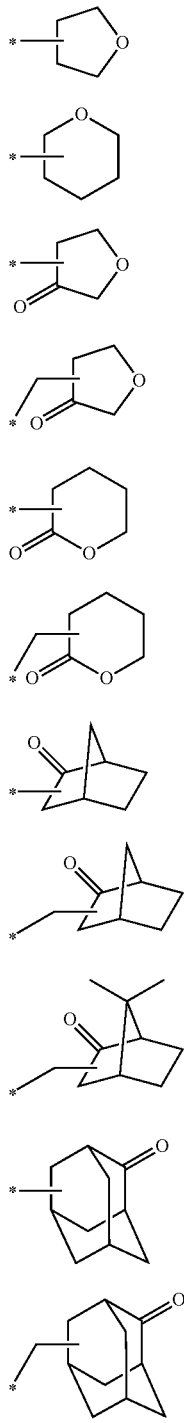

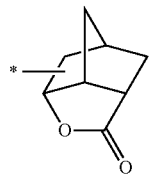

where "*" represents a binding position.

Examples of the hydrocarbon group which has a fluorine atom include fluoroalkyl groups such as a fluoromethyl group, a fluoroethyl group, a fluoropropyl group, a fluorobutyl group, a fluoropentyl group, a fluorohexyl group, a fluoroheptyl group and a fluorooctyl group; alicyclic fluorohydrocarbon groups such as C3-C10 fluorocycloalkyl groups; C6-C10 aromatic fluorohydrocarbon groups such as a fluorophenyl group and fluoronaphtyl group, and a combined structure of them. The hydrocarbon group which has a fluorine atom is preferably a C1-C10 fluoroalkyl group and a C6-C10 aromatic fluorohydrocarbon group, and more preferably a C1-C8 perfluoroalkyl group, and still more preferably a C1-C4 perfluoroalkyl group.

The compound represented by formula (B1) includes the compounds represented by formulae (b1), (b2) and (b3), preferably the compounds represented by formulae (b1) and (b2), more preferably the compounds represented by formula (b1).

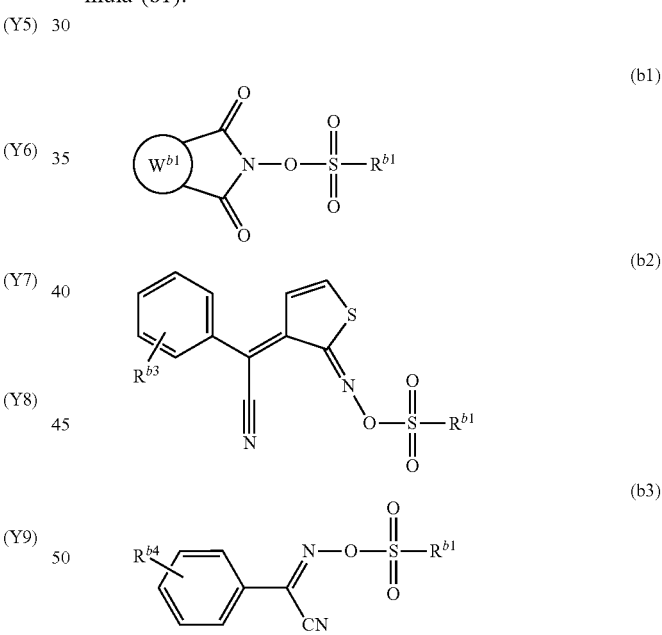

where $R^{b1}$ is as defined above, $R^{b2}$, $R^{b3}$ and $R^{b4}$ each independently represent a hydrogen atom, a C1-C5 alkyl group or a C1-C5 alkoxy group, and the ring $W^{b1}$ represents a C6-C14 aromatic hydrocarbon ring which can have a substituent and a C6-C14 aromatic heterocyclic group which optionally has a substituent.

The alkyl group represented by $R^{b2}$, $R^{b3}$ and $R^{b4}$ includes a methyl group, an ethyl group, a propyl group, a butyl group, and a pentyl group, preferably a methyl group.

The alkoxy group represented by $R^{b2}$, $R^{b3}$ and $R^{b4}$ includes a methoxy group, an ethoxy group, a propoxy group, a butoxy group, and a pentyloxy group, preferably a methoxy group.

The aromatic hydrocarbon ring represented by the ring $W^1$ includes a benzene ring, a naphthalene ring, and anthracene ring.

The aromatic heterocyclic group represented by the ring $W^{b1}$ may have a sulfur or oxygen atom, which includes the following ones:

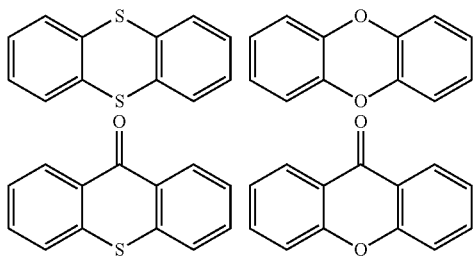

The substituent which the ring $W^{b1}$ optionally has includes a C1-C5 alkyl group.

The ring $W^{b1}$ is preferably a substituted or unsubstituted naphthalene ring, more preferably an unsubstituted naphthalene ring.

The compound represented by formula (b1) is preferably a compound represented by any one of formulae (b4) to (b7), more preferably a compound represented by formula (b4).

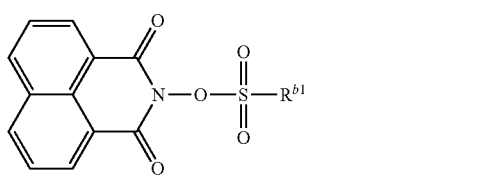
(b4)

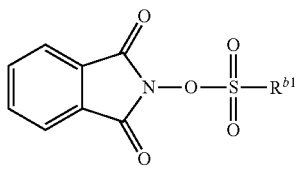
(b5)

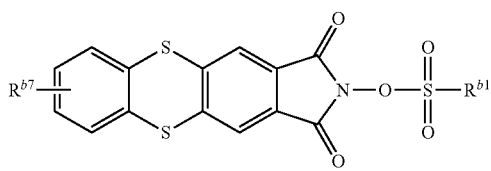
(b6)

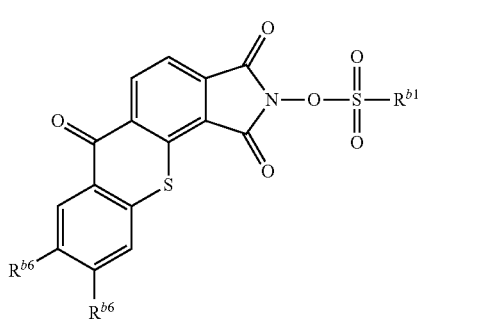
(b7)

where $R^{b1}$ is as defined above, $R^{b5}$, $R^{b6}$ and $R^{b7}$ each independently represent a hydrogen atom, or a C1-C5 alkyl group.

Specific examples of the compound represented by formula (b1) include preferably those represented by formulae (b1-1) to (b1-1), more preferably those represented by formulae (b1-6) to (b1-11), and still more preferably those represented by formulae (b1-6) and (b1-7).

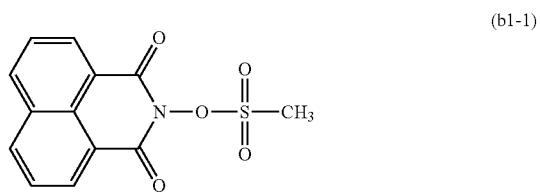
(b1-1)

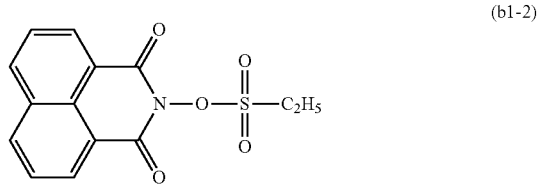
(b1-2)

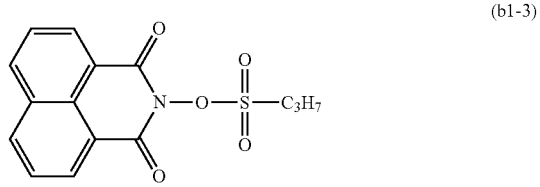
(b1-3)

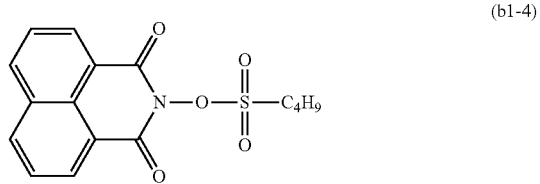
(b1-4)

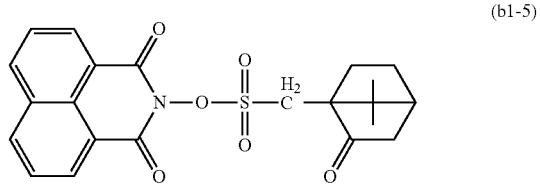
(b1-5)

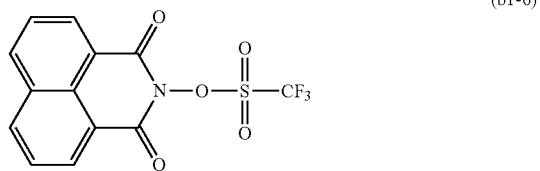
(b1-6)

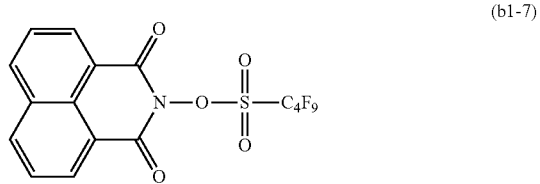
(b1-7)

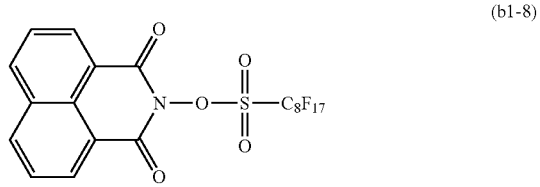
(b1-8)

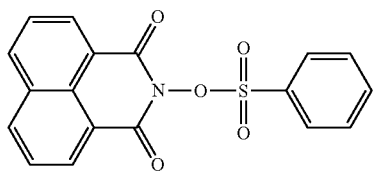
(b1-9)

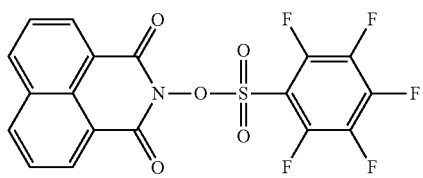
(b1-10)

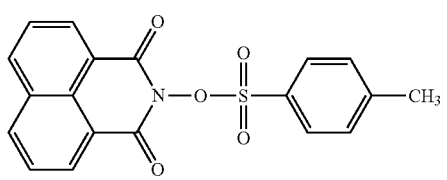
(b1-11)

Specific examples of the compound represented by formula (b2) include the following compounds.

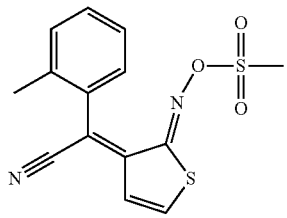

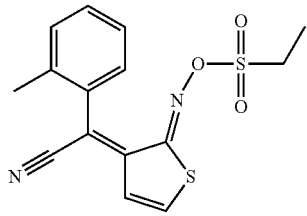

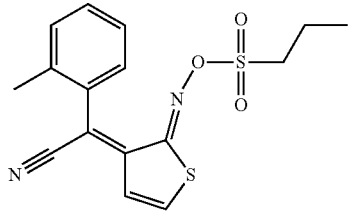

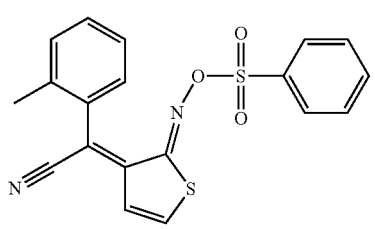

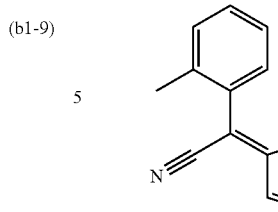

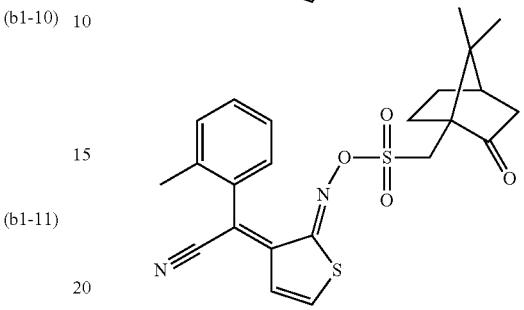

Specific examples of the compound represented by formula (b3) include the following compounds.

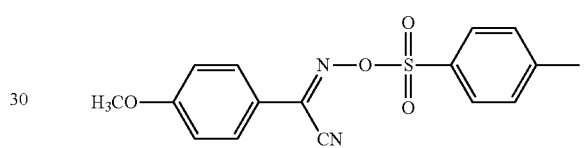

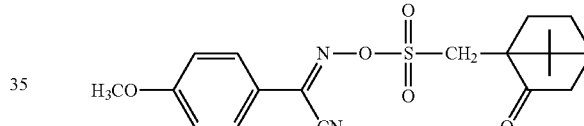

The ionic acid generator is preferably a compound represented by formula (b8) or (b9).

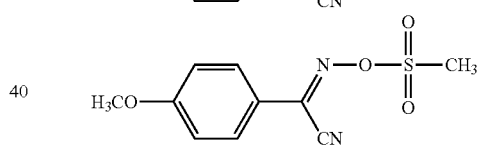
(b8)

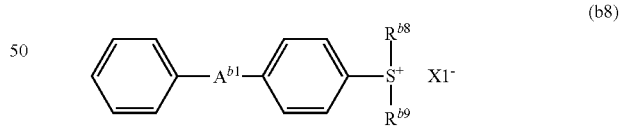
(b9)

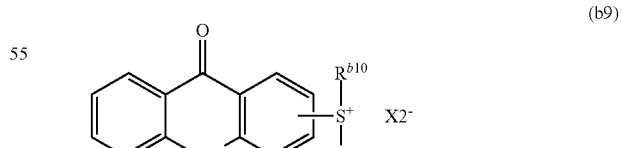

where $A^{b1}$ and $A^{b2}$ each independently represent an oxygen atom or a sulfur atom, $R^{b8}$, $R^{b9}$, $R^{b10}$ and $R^{b11}$ each independently represent a C1-C10 alkyl group or a C6-C12 aromatic hydrocarbon group, and $X1^-$ and $X2^-$ each independently represent an organic anion.

The alkyl groups represented by $R^{b8}$, $R^{b9}$, $R^{b10}$ and $R^{b11}$ include a methyl group, an ethyl group, a propyl group, a butyl group, a pentyl group, a hexyl group, a heptyl group and an octyl group.

The aromatic hydrocarbon groups represented by $R^{b8}$, $R^{b9}$, $R^{b10}$ and $R^{b11}$ include an aryl group such as phenyl group, a naphthyl group, an anthryl group, p-methylphenyl group, p-tert-buthylphenyl group, p-adamantylphenyl group, tolyl group, xylyl group, a cumenyl group, a mesityl group, a biphenyl group, a phenanthryl group, a 2,6-diethylphenyl group, and 2-methyl-6-ethylphenyl.

$R^{b8}$, $R^{b9}$, $R^{b10}$ and $R^{b11}$ are preferably a C6-C12 aromatic hydrocarbon group, more preferably a phenyl group.

Examples of $X1^-$ and $X2^-$ include sulfonic acid anion, bis(alkylsulfonyl)amide anion and tris(alkylsulfonyl)methide anion. Preferable is a sulfonic acid anion, specifically a sulfonic acid anion represented by formula (b10).

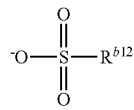

(b10)

where $R^{b12}$ represents a C1-C18 hydrocarbon group where a hydrogen atom can be replaced by a fluorine atom and where a methylene group may be substituted with an oxygen atom or a carbonyl group.

Examples of $R^{b12}$ include those of $R^{b1}$.

The compound represented by formula (b8) includes the following compounds.

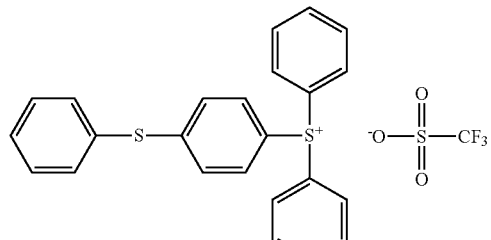

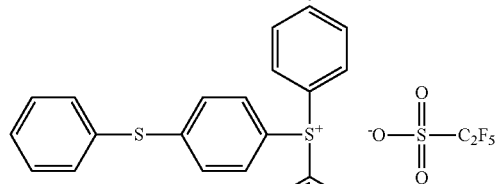

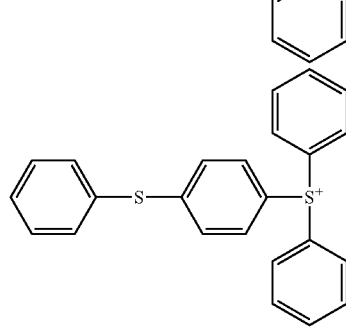

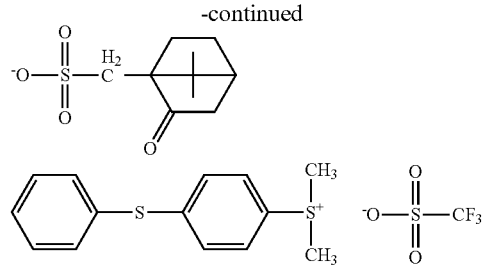

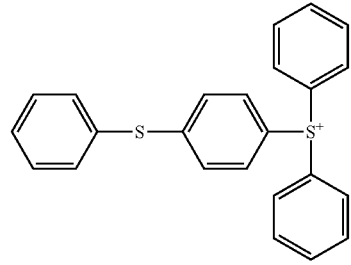

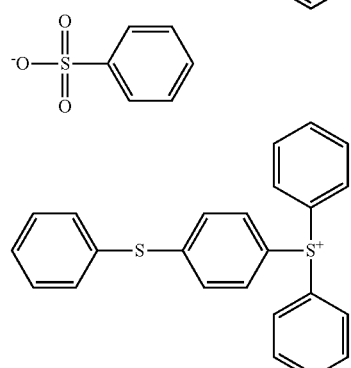

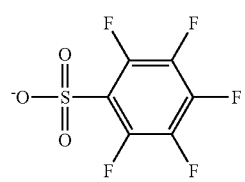

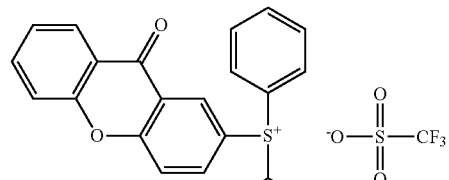

The compound represented by formula (b9) includes the following compounds.

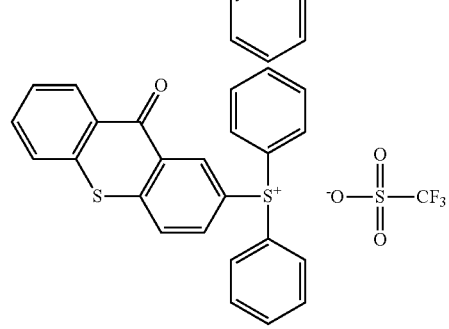

-continued

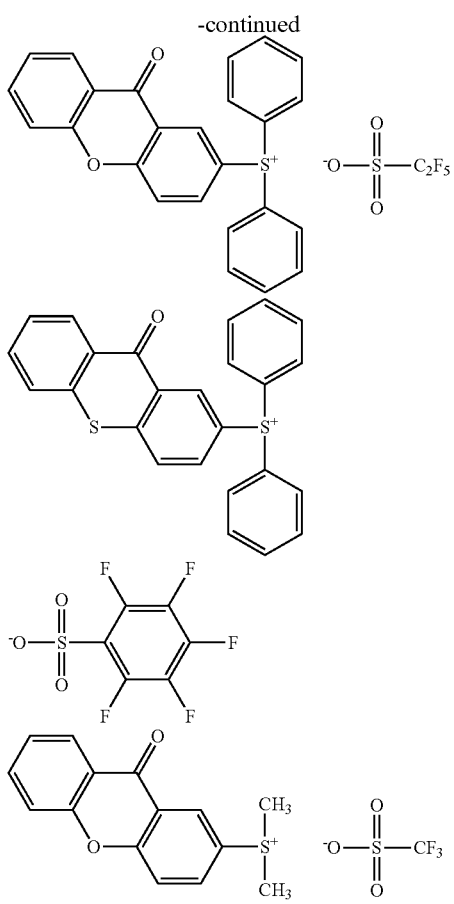

The acid generator is available on the market, or it can be prepared by a known method.

The content of the acid generator is preferably 0.5 to 30 parts by weight, more preferably 1 to 25 parts by weight, per 100 parts of the total resin.

The photoresist composition of the present invention may further comprise a quencher. The quencher has a property that it can trap an acid, especially an acid generated from the acid generator by applying a radiation. Examples of the quencher, which is not limited to any specific one, include a basic nitrogen-containing organic compound.

Examples of the basic nitrogen-containing organic compound include an amine compound such as an aliphatic amine, an aromatic amine and an ammonium salt. Examples of the aliphatic amine include a primary amine, a secondary amine and a tertiary amine.

Examples of amine compounds include those represented by the formulae (C1) and (C2):

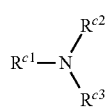
(C1)

wherein $R^{c1}$, $R^{c2}$ and $R^{c3}$ independently represent a hydrogen atom, a C1-C6 alkyl group, a C5-C10 alicyclic hydrocarbon group or a C6-C10 aromatic hydrocarbon group, and the alkyl group and the alicyclic hydrocarbon group can have a substituent selected from the group consisting of a hydroxyl group, an amino group and a C1-C6 alkoxy group, and the aromatic hydrocarbon group can have a substituent selected from the group consisting of C1-C6 alkyl groups, a C5-C10 alicyclic hydrocarbon group and a C1-C6 alkoxy group;

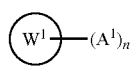
(C2)

wherein the ring $W^1$ is a nitrogen-containing heterocyclic ring, or a benzene ring having a substituted or unsubstituted amino group,
$A^1$ represents a phenyl group or a naphtyl group, and
n represents an integer of 2 or 3.

For formula (C1), examples of the alkyl group include a methyl group, an ethyl group, a propyl group, a butyl group, a pentyl group and a hexyl group; examples or the alicyclic hydrocarbon groups, which may be a monocyclic or polycyclic one, include a C5-C10 cycloalkyl group (e.g. a cyclopentyl group, a cyclohexyl group, a methylcyclohexyl group, a dimethylcyclohexyl group, a cycloheptyl group and a cyclooctyl group) and a polycyclic alicyclic hydrocarbon group such as a decahydronaphthyl group, an adamantyl group, and a norbornyl group; examples of aromatic hydrocarbon group include a phenyl group a naphtyl group; and, examples of the alkoxy group include a methoxy group, an ethoxy group, a propoxy group, a butoxy group, a pentyloxy group and a hexyloxy group.

Examples of the compound represented by the formula (C1) include 1-naphthylamine, 2-naphthylamine, aniline, diisopropylaniline, 2-methylaniline, 3-methylaniline, 4-methylaniline, 4-nitroaniline, N-methylaniline, N,N-dimethylaniline, diphenylamine, hexylamine, heptylamine, octylamine, nonylamine, decylamine, dibutylamine, dipentylamine, dihexylamine, diheptylamine, dioctylamine, dinonylamine, didecylamine, triethylamine, trimethylamine, tripropylamine, tributylamine, tripentylamine, trihexylamine, triheptylamine, trioctylamine, trinonylamine, tridecylamine, methyldibutylamine, methyldipentylamine, methyldihexylamine, methyldicyclohexylamine, methyldiheptylamine, methyldioctylamine, methyldinonylamine, methyldidecylamine, ethyldibutylamine, ethyldipentylamine, ethyldihexylamine, ethydiheptylamine, ethyldioctylamine, ethyldinonylamine, ethyldidecylamine, dicyclohexylmethylamine, tris[2-(2-methoxyethoxy)ethyl]amine, triisopropanolamine, ethylenediamine, tetramethylenediamine, hexamethylenediamine, 4,4'-diamino-1,2-diphenylethane, 4,4'-diamino-3,3'-dimethyldiphenylmethane and 4,4'-diamino-3,3'-diethyldiphenylmethane.

Among them, preferred is diisopropylaniline, and more preferred is 2,6-diisopropylaniline.

For the ring $W^1$ in formula (C2), the substituted or unsubstituted amino group is specifically represented by —$NR^4R^5$ where $R^4$ and $R^5$ each independently represent a hydrogen atom, a C1-C10 aliphatic hydrocarbon group, a C3-C10 alicyclic hydrocarbon group, a C6-C14 aromatic hydrocarbon group. For $R^4$ and $R^5$, examples of the aliphatic hydrocarbon group include an alkyl group such as a methyl group, an ethyl group, a propyl group, butyl group, a pentyl group, a hexyl group, a heptyl group and an octyl group. Examples of the alicyclic hydrocarbon group include the same as referred to for $R^{c1}$, $R^{c2}$ and $R^{c3}$. Examples of the aromatic hydrocarbon group include an aryl group such as a phenyl group, a naphthyl group, a p-methylphenyl group, a p-tert-butylphenyl group, a p-adamantylphenyl group, a tolyl group, a xylyl group, a cumyl group, a mesityl group, a biphenyl group, an anthryl group, a phenanthryl group, a 2,6-diethylphenyl group and a 2-methyl-6-ethylphenyl group.

Herein, the nitrogen-containing heterocyclic ring means a heterocyclic ring which has a nitrogen atom as its ring-constituting atom.

For the ring $W^1$ in formula (C2), the nitrogen-containing heterocyclic ring may be aromatic or non-aromatic, which may have another hetero atom such as an oxygen atom or sulfur atom. The heterocyclic ring has usually 1 to 3 nitrogen atoms. The heterocyclic ring represented by $W^1$ includes the rings represented by formulae (Y13) to (Y28).

 (Y13)

 (Y14)

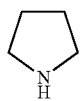 (Y15)

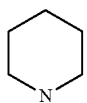 (Y16)

 (Y17)

 (Y18)

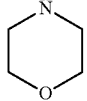 (Y19)

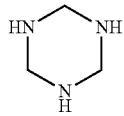 (Y20)

 (Y21)

 (Y22)

 (Y23)

 (Y24)

 (Y25)

 (Y26)

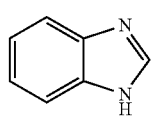 (Y27)

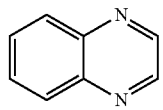 (Y28)

The ring $W^1$ is preferably a 5- to 6-membered aromatic heterocyclic ring constituted by carbon atoms and one or two nitrogen atoms, specifically a ring represented by any one of formulae (Y20) to (Y25). The heterocyclic ring and the benzene ring each represented by the ring $W^1$ can have a hydroxyl group or C1-C4 alkyl group.

The compound represented by formula (C2) includes those represented by formulae (C2-1) to (C2-11), preferably those represented by formulae (C2-2) to (C2-8).

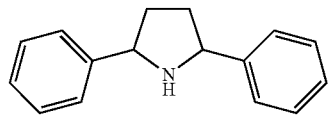 (C2-1)

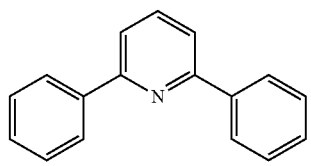 (C2-2)

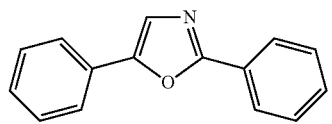 (C2-3)

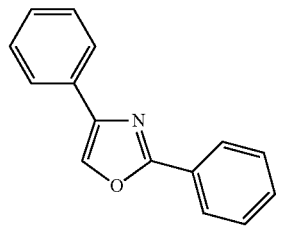 (C2-4)

(C2-5)
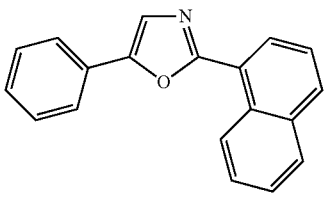

(C2-6)
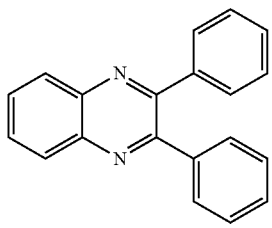

(C2-7)
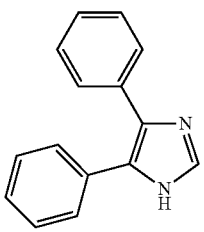

(C2-8)
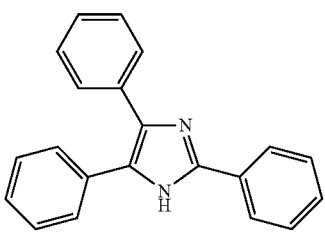

(C2-9)
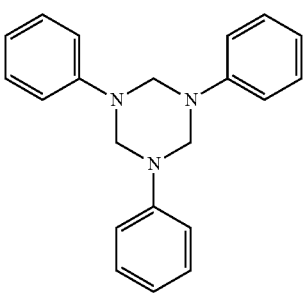

(C2-10)
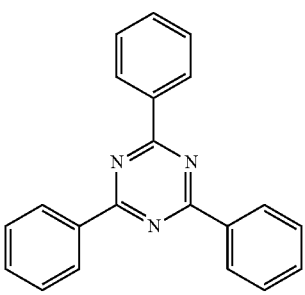

(C2-11)
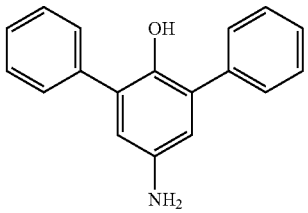

The quencher can be prepared by a known method, which is available on the market.

The content of the quencher is preferably 0.01 to 4%, more preferably 0.02 to 3% based on sum the solid components of the photoresist composition.

The photoresist composition of the present invention comprises a solvent. Examples of the solvent include a glycol ether ester such as ethyl cellosolve acetate, methyl cellosolve acetate and propylene glycol monomethyl ether acetate; a glycol ether such as propylene glycol monomethyl ether; an acyclic ester such as ethyl lactate, butyl acetate, amyl acetate and ethyl pyruvate; a ketone such as acetone, methyl isobutyl ketone, 2-heptanone and cyclohexanone; and a cyclic ester such as γ-butyrolactone.

The amount of the solvent is 40% by weight or more, preferably 45% by weight or more preferably 50% by weight or more of the total amount of the photoresist composition of the present invention. The amount of the solvent is 75% by weight or less, preferably 70% by weight or less, and more preferably 68% by weight or less, of the total amount of the photoresist composition of the present invention.

When the photoresist composition comprises a solvent within the above-mentioned range, it can easily form a composition film with thickness 3 μm to 150 μm.

The photoresist composition of the present invention may comprise if necessary, a small amount of various additives such as a sensitizer, a dissolution inhibitor, other polymers, a surfactant, a stabilizer and a dye as long as the effect of the present invention is not prevented.

The photoresist composition of the present invention can usually be prepared by mixing, in a solvent, an acid generator, Resin (A1), Compound (I), and if necessary additives at a suitable ratio for the composition, optionally followed by filtrating the mixture with a filter having from 0.11 μm to 50 μm in a pore size.

The order of mixing these components is not limited to any specific order. The temperature at mixing the components is usually 10 to 40° C., which can be selected depending on the resin or the like. The mixing time is usually 0.5 to 24 hours, which can be selected in view of the temperature. The means for mixing the components is not limited to specific ones, which includes a stirrer.

The amounts of the components in the photoresist composition can be adjusted by selecting the amount to be used for production of them.

The method of the present invention comprises the following steps (1) to (4):
(1) a step of applying the photoresist composition of the present invention on a substrate,
(2) a step of forming a photoresist composition film by drying the composition,
(3) a step of exposing the film to radiation, and
(4) a step of developing the exposed film to form a photoresist pattern.

The applying of the composition on a substrate is usually conducted using a conventional apparatus such as spin coater.

The substrate includes silicon wafers. The substrate on which semiconductor elements (e.g., a transistor, a diode) may be formed in advance can be used for the process.

If the photoresist composition is to be used for bump formation, a substrate on which a conductive material has been laminated is preferred. Such conductive material includes an alloy which comprises a metal selected from the group consisting of gold (Au) copper (Cu), nickel (Ni), tin (Sn), palladium (Pd) and silver (Ag), or alloys comprising a metal selected from the group. Preferred is copper or an alloy comprising copper.

The substrate may be washed or coated with a reflect-preventing layer such as one containing hexamethyldisilazane.

For forming the reflect-preventing layer, such composition for organic reflect-preventing layer as available on the market can be used.

The photoresist composition film is usually formed by drying the applied composition with a heating apparatus such as hot plate or a decompressor, to thereby dry off the solvent.

The heating temperature is preferably 50 to 200° C., and the operation pressure is preferably 1 to $1.0*10^5$ Pa.

The thickness of the film obtained by step (2) is in the range of preferably 3 μm to 150 μm, more preferably 4 μm to 100 μm.

The film is exposed to radiation using an exposure system. The exposure is usually conducted through a mask having a pattern corresponding to a desired photoresist pattern. The exposure source includes known one, preferably g ray (wavelength: 436 nm), h ray (wavelength: 405 nm) and i ray (wavelength: 365 nm).

The process may further comprise baking the exposed film, so called post-exposure bake, after step (3).

The step of baking the exposed film can be conducted with heating means such as hot plates. The temperature of baking the exposed film is preferably 50° C. to 200° C., and more preferably 60° C. to 120° C. The time of baking is usually 40 to 400 seconds, preferably 50 to 350 seconds.

The development of the exposed or baked photoresist composition film is usually carried out with an alkaline developer using a development apparatus.

The alkaline developer to be used may be anyone of various alkaline aqueous solution to be used in the art. Generally, an aqueous solution of tetramethylammonium hydroxide or (2-hydroxyethyl)trimethylammonium hydroxide (commonly known as "choline") is often used.

After development, the formed photoresist pattern is preferably washed with ultrapure water, and the remained water on the photoresist pattern and the substrate is preferably removed.

The photoresist composition of the present invention can provide thick photoresist films and fine photoresist pattern on such thick film so that the composition is suitable for producing bumps.

The photoresist composition of the present invention is useful as a material for producing bumps.

Bumps can be produced by the process comprising the following steps;

laminating a conductive material (e.g. seed metal) on a wafer which has semiconductor elements thereon to thereby form a conductive film, producing a photoresist pattern on the conductive film from the composition of the present invention, pattern plating an electrode material such as Cu, Ni or solder, using the photoresist pattern as its mold, and removing the photoresist film and the conductive film from the device by etching or the like, optionally followed by removing the electrode material by heat-melting the electrode material.

EXAMPLES

The present invention will be described more specifically by Examples, which are not construed to limit the scope of the present invention.

The "%" and "part(s)" used to represent the content of any component and the amount of any material used in the following examples and comparative examples are on a weight basis unless otherwise specifically noted.

The weight-average molecular weight of any material used in the following examples is a value determined by gel permeation chromatography under the following conditions.

Equipment: HLC-8120GPC type, manufactured by TOSOH CORPORATION

Column: TSKgel Multipore $H_{XL}$-$M_X$ 3 with guard column, manufactured by TOSOH CORPORATION Solvent: tetrahydrofuran Flow rate: 1.0 mL/min.

Detector: RI Detector

Column temperature: 40° C.

Injection volume: 100 μL

Standard reference material: standard polystyrene, manufactured by TOSOH CORPORATION Synthesis Example 1

To a four-necked flask with a stirring device, a reflux condenser and a thermometer, 118 parts of 1,4-dioxane was added and then heated to 77° C.

Dissolved were 54.7 parts of 1-ethylcyclopentyl methacrylate, 29.8 parts of polyethyleneglycolmonomethylether methacrylate (Trade name: light ester 130MA, Kyoeisha Chemistry Co., Ltd.), 45.2 parts of methoxydiethyleneglycol methacrylate and 0.4 parts of azobisisobutyronitrile in 59 parts of 1,4-dioxane.

Polyethyleneglycolmonomethylether methacrylate is represented as follow:

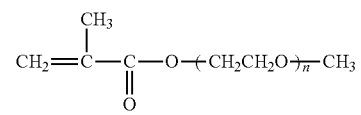

where n is 9.

The obtained solution was dropped to the heated 1,4-dioxane over 1 hour, followed by stirring them at 77° C. for 10 hours. Then the reaction mixture was cooled and then diluted with 130 parts of methanol and 92 parts of propyleneglycolmethylether acetate. The diluted reaction mixture was poured into 1440 parts of water to make the resin precipitate. The precipitated resin was collected by filtration and dissolved in 184 parts of propyleneglycolmethylether acetate, followed by pouring the solution into a mixture of 423 parts of methanol and 918 parts of water to make the resin precipitate. The obtained precipitates were dissolved in propyleneglycolmethylether acetate and then concentrated to obtain 40% by weight of resin solution.

The obtained resin is referred to as "Resin A1-1", the weight average molecular weight of which was $1.6 \times 10^5$. Resin A1-1 comprises the following structural units.

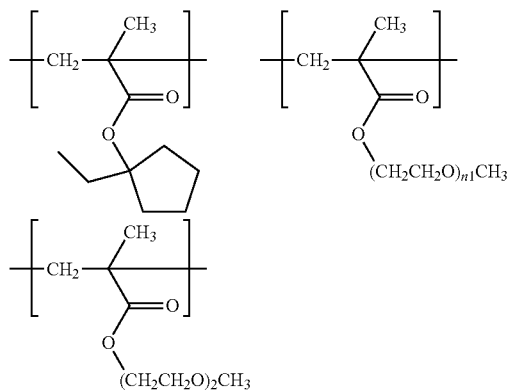

$n1 \neq 9$

Synthesis Example 2

Twenty (20) parts of polyvinylphenol (Trade name VP-15000, Product of Nippon Soda Co., Ltd.) were dissolved in 240 parts of methylisobutylketone, followed by concentrating it with an evaporator.

To a four-necked flask with a stirring device, a reflux condenser and a thermometer, the concentrated mixture and 0.003 parts of p-toluenesulfonic acid dehydrates were poured and then 5.05 parts of ethylvinylether was dropped thereinto at a temperature of 20 to 25° C. over 10 minutes. The obtained mixture was stirred at the above-mentioned temperature for 2 hours and then diluted with 200 parts of methylisobutylketone, followed by washing it with ion-exchanged water five times. The washed mixture was concentrated until its amount became 45 parts using an evaporator, and 150 parts of propyleneglycolmonomethylether acetate were added thereto, followed by concentrating it again to obtain 78 parts of propyleneglycolmonomethylether acetate solution (29% of solid content) of resin A1-2, the weight average molecular weight of which was 22100, and in which the content of the ethoxyethyl group were 38.5%. Resin A1-2 comprises the following structural units.

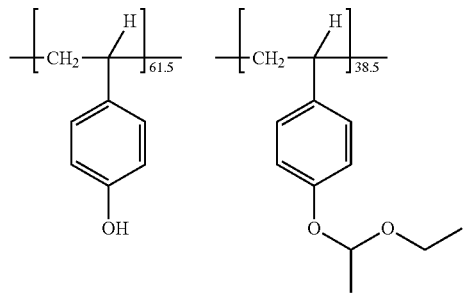

Synthesis Example 3

To a four-necked flask with a stirring device, a reflux condenser and a thermometer, 413.5 parts of 2,5-xylenol, 103.4 parts of salicylaldehyde, 20.1 parts of p-toluenesulfonic acid and 826.9 parts of methanol were poured, and heated to make the mixture refluxed and then the temperature of the mixture was kept for 4 hours. Then the obtained mixture was cooled, and 1320 parts of methylisobutylketone was fed thereto, followed by distilling 1075 parts of the mixture away. Then 762.7 parts of m-cresol and 29 parts of 2-tert-butyl-5-methylphenol were added to the residues and heated to 65° C., followed by dropping 678 parts of 37% formalin thereto over 1.5 hours while controlling the temperature of the mixture to be 87° C. at the end of dropping. Then the temperature of the mixture was kept at 87° C. for 10 hours, and then 1115 parts of methylisobutylketone was added to the obtained resin solution, followed by washing it with water three times. To the washed resin solution, 500 parts of methylisobutylketone was added, followed by concentrating it under reduced pressure until the amount of solution became 3435 parts. To the washed resin solution, 3796 parts of methylisobutylketone and 4990 parts of n-heptane were added and heated to 60° C., and then stirred for 1 hour, followed by separating therefrom the resin solution. To the separated resin solution, 3500 parts of propyleneglycol-monomethylether acetate was added to dilute it, followed by concentrating it under reduced pressure until the amount of solution became 1690 parts (43% of solid content).

The obtained novolak resin is referred to as "Resin A2-1", the weight average molecular weight of which was 7000.

Synthesis Example 4

To a four-necked flask with a stirring device, a reflux condenser and a thermometer, 537 parts of 2,5-xylenol, 107.5 parts of salicylaldehyde, 20.9 parts of p-toluenesulfonic acid and 860 parts of methanol were poured, and heated to make the mixture refluxed and then the temperature of the mixture was kept for 4 hours. Then the obtained mixture was cooled, and 1440 parts of methylisobutylketone was fed thereto, followed by distilling 1120 parts of the mixture away. Then 476 parts of m-cresol was added to the residues and heated to 65° C., followed by dropping 571 parts of 37% formalin thereto over 1.5 hours while controlling the temperature of the mixture to be 87° C. at the end of dropping. Then the temperature of the mixture was kept at 87° C. for 10 hours, and then 884 parts of methylisobutylketone was added to the obtained resin solution, followed by washing it with water three times. To the washed resin solution, 600 parts of methylisobutylketone was added, followed by concentrating it under reduced pressure until the amount of solution became 2875 parts. To the washed resin solution, 3514 parts of methylisobutylketone and 4647 parts of n-heptane were added and heated to 60° C., and then stirred for 1 hour, followed by separating therefrom the resin solution. To the separated resin solution, 3500 parts of methylisobutylketone was added to dilute it, followed by concentrating it under reduced pressure until the amount of solution became 1520 parts (30% of solid content).

The obtained novolak resin is referred to as "Resin A2-2", the weight average molecular weight of which was 7000.

Synthesis Example 5

Three hundred [300] parts of poly(p-hydroxy styrene), "MARUKA LYNCUR" S2P (registered trademark) was dispersed in 1,200 parts of ion exchanged water. Thereto 980 parts of resin A2-2 and 1,330 parts of methylisobutylketone were added and dissolved, followed by removing water phase therefrom. The obtained mixture was concentrated until the amount of that became 1600 parts. Thereto 750 parts of methylisobutylketone were added and then concentrated until the amount of that became 1620 parts.

To a four-necked flask with a stirring device, a reflux condenser and a thermometer, the obtained mixture, 1,400 parts of propyleneglycolmonomethylether acetate, 980 parts of methylisobutylketone and 0.09 parts of p-toluenesulfonic acid were added and 83 parts of 1,4-cyclohexanedimethanoldivinyl ether, which is represented by formula (z), was dropped thereinto over 5 minutes at room temperature, followed by being stirred for 5 hours at room temperature. Then 0.16 parts of triethylamine was added thereto, and washed with 1000 parts of ion exchanged water, followed by separating resin mixture therefrom: the washing step was performed 5 times. The obtained resin mixture was concentrated until its amount became 1200 parts, and then 2,170 parts of propyleneglycolmonomethylether acetate was added thereto, followed by being concentrated until its amount became 2,000 parts to obtain a solution containing Resin A1-3 (solid content: 23%).

The weight average molecular weight of Resin A1-3 was $9.22 \times 10^4$.

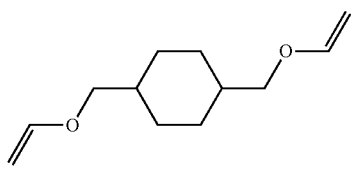

(Z)

Synthesis Example 6

Into a four-necked flask with a stirring device, a reflux condenser and a thermometer, 10 parts of 2,5-mercapto-1,3,4-thiadiazole and 60 parts of methanol were poured and stirred at room temperature.

Seven (7) parts of triethylamine were dropped into the obtained mixture in an ice bath, and then 10 parts of p-chloromethylstyrene was dropped at room temperature.

The obtained mixture was stirred for 4 hours and then cooled to 10° C., followed by separating into a reaction product by suction filtration. The products were washed with methanol and then dried to obtain 10 parts of Compound (I6) represented by formula (I6). Yield: 60%

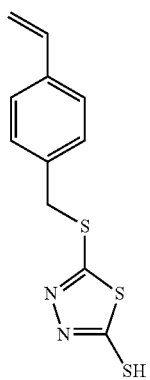

(I6)

Synthesis Example 7

In a four-necked flask with a stirring device, a reflux condenser and a thermometer, 20 parts of p-(1-ethoxyethoxyl)styrene, 4 parts of m-tert-butoxystyrene, 1 part of Compound (I6), 5 parts of triethylamine, 0.9 parts of 2,2'-azobis(2,4-dimethylvaleronitrile) and 23 parts of methylisobutylketone were mixed, and the obtained mixture was dropped into 15 parts of methylisobutylketone, which had been heated to 70° C. in advance.

Then the obtained mixture was stirred for 6 hours and then cooled to 40° C., followed by adding 3N hydrochloric acid. The obtained mixture was stirred for 4 hours, and separated into an organic mixture. The separated one was washed with 50 parts of ion exchanged water five times. To the washed mixture 50 parts of methanol was added and then concentrated. Then to concentrated mixture 50 parts of methylisobutylketone was added and dissolved therein.

To the obtained solution, 350 parts of n-heptane was added and filtrated. Then the obtained filtrates was washed with ion exchanged water and then dried to 10 parts of Resin (I7) which comprises the following structure units. The weight average molecular weight of the resin was $1.27 \times 10^4$.

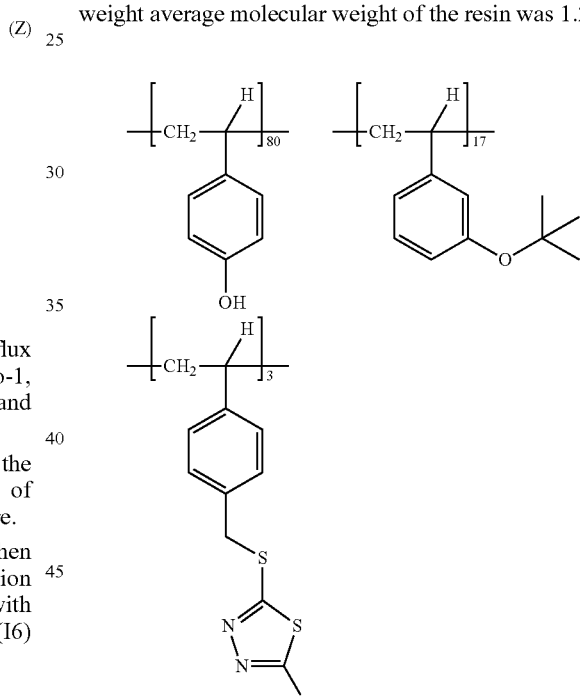

Examples 1 to 12 and Comparative Examples 1 to 3 The following components listed in Table 1 and the surfactant mentioned below were mixed and dissolved in the solvent as mentioned below, and further filtrated through a fluorine resin filter having pore diameter of 0.5 µm to prepare photoresist compositions. The contents of the components in each example are shown in Table 1.

The symbols recited in Table 1 represent the following components.
<Resin>
A1-1: Resin A1-1
A1-2: Resin A1-2
A1-3: Resin A1-3
A2-1: Resin A2-1
<Acid Generator>

B1: The compound represented by formula, trade name "NAI-105", product by Midori Kagaku, Co., Ltd.

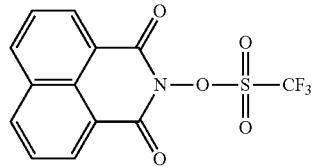 [SMILES: O=C1c2cccc3cccc(c23)C(=O)N1OS(=O)(=O)C(F)(F)F]

B2: The compound, trade name "SP-606", product by ADEKA, Co., Ltd.

<Quencher>
I1: 2,4,5-triphenylimidazole (Product of Tokyo Chemical Industry, Co., Ltd.)
C2: N,N-dicyclohexylmethylamine (Product of Aldrich Corporation)

<Compound (I)>
I1: bismuthiol (Product of Tokyo Chemical Industry, Co., Ltd.)
I2: 1,3,4-thiadiazole-2-thiol (Product of Tokyo Chemical Industry, Co., Ltd.)
I3: 2-thiophenethiol (Product of Tokyo Chemical Industry, Co., Ltd.)
I4: 2-mercaptobenzothiazole (Product of Tokyo Chemical Industry, Co., Ltd.)
I5: 2-t-butyl-mercaptotriazole (Product of Wako Pure Chemical, Co., Ltd.)
I7: Resin (17)
S1: 1-thioglycerol (Product of Tokyo Chemical Industry, Co., Ltd.)

<Solvent>
Propyleneglycolmonomethylether acetate

<Surfactant>
Polyether denaturated silicone oil (Toray silicone SH8400; Product of Toray Dow Corning, Co., Ltd.) 0.0019 parts

TABLE 1

| Ex. No. | Resin (Kind/parts) | Acid generator (Kind/parts) | Quencher (Kind/parts) | Compound (I) (parts) | Solvent (parts) | PB(° C.)/PEB(° C.) |
|---|---|---|---|---|---|---|
| 1 | A1-1/7.425 A2-1/6.075 | B1/0.3 | C1/0.06 | I1/0.01 | 24 | 110/90 |
| 2 | A1-2/7.425 A2-1/6.075 | B1/0.3 | C1/0.06 | I1/0.01 | 21 | 110/undone |
| 3 | A1-2/13.5 | B1/0.3 | C1/0.06 | I1/0.01 | 21 | 110/undone |
| 4 | A1-2/7.425 A2-1/6.075 | B1/0.3 | C1/0.06 | I2/0.01 | 21 | 110/undone |
| 5 | A1-2/7.425 A2-1/6.075 | B1/0.3 | C1/0.06 | I3/0.01 | 21 | 110/undone |
| 6 | A1-2/7.425 A2-1/6.075 | B2/0.2 | C1/0.06 | I1/0.01 | 21 | 110/undone |
| 7 | A1-2/7.425 A2-1/6.075 | B2/0.2 | C1/0.06 | I4/0.01 | 21 | 110/undone |
| 8 | A1-2/7.425 A2-1/6.075 | B2/0.2 | C1/0.06 | I5/0.01 | 21 | 110/undone |
| 9 | A1-2/7.425 A2-1/6.075 | B2/0.3 | C1/0.06 | I7/1.00 | 21 | 110/undone |
| 10 | A1-3/8.100 A1-2/4.050 | B1/0.07 | C1/0.02 | I1/0.01 | 15 | 110/70 |
| 11 | A1-3/8.100 A1-2/4.050 | B2/0.08 | C1/0.02 | I1/0.01 | 15 | 110/70 |
| 12 | A1-3/8.100 A1-2/4.050 | B1/0.07 | C1/0.02 | I1/0.01 | 15 | 110/70 |
| C1 | A1-2/7.425 A2-1/6.075 | B1/0.3 | C1/0.06 | S1/0.01 | 21 | 110/undone |
| C2 | A1-2/7.425 A2-1/6.075 | B1/0.3 | C1/0.06 | — | 21 | 110/undone |
| C3 | A1-2/7.425 A2-1/6.075 | B1/0.3 | C1/0.06 | — | 24 | 110/90 |

Note:
The "C1", "C2" and "C3" represent respectively Comparative Examples 1, 2 and 3.

(Preparation of Photoresist Pattern)

Photoresist Patterns Prepared from the Photoresist Compositions of Examples 1 to 9 and Comparative Examples 1 to 3

Over the substrate (4 inches) where copper had been vapor-deposited on a silicon wafer, each of the photoresist compositions prepared as above was spin-coated so that the thickness of the resulting film became 10 μm after drying. The cupper substrates thus coated with the respective photoresist compositions were each prebaked on a direct hotplate at the temperature as shown in the columns "PB" of Table 1 for 180 seconds.

Using an i-ray stepper ("NSR 1755i7A" manufactured by Nikon, NA=0.5) and a mask for forming a contact hole pattern with hole diameter: 20 μm and pitch: 40 μm, each wafer thus formed with the respective film was subjected to exposure with the exposure quantity being varied stepwise.

After exposure, each wafer was subjected to post-exposure baking on a hotplate at the temperature as shown in the columns "PEB" of Table 1 for 60 seconds.

After the exposure, each wafer was subjected to paddle development for 60 seconds with an aqueous solution of 2.38 wt % tetramethylammonium hydroxide.

Photoresist Patterns Prepared from the Photoresist Compositions of Examples 10 to 12

Over the substrate (4 inches) where copper had been vapor-deposited on a silicon wafer, each of the photoresist compositions prepared as above was spin-coated so that the thickness of the resulting film became 50 m after drying. The cupper substrates thus coated with the respective photoresist compositions were each prebaked on a direct hotplate at the temperature as shown in the columns "PB" of Table 1 for 300 seconds.

Using an i-ray stepper ("NSR 1755i7A" manufactured by Nikon, NA=0.5) and a mask for forming a contact hole pattern with hole diameter: 20 μm and pitch: 40 μm, each wafer thus formed with the respective film was subjected to exposure with the exposure quantity being varied stepwise.

After exposure, each wafer was subjected to post-exposure baking on a hotplate at the temperature as shown in the columns "PEB" of Table 1 for 300 seconds.

After the exposure, each wafer was subjected to paddle development for 60 seconds with an aqueous solution of 2.38 wt % tetramethylammonium hydroxide.

(Electrolytic Plating on the Photoresist Pattern)

Each substrate which comprises a photoresist film having a photoresist pattern was subjected to electrolytic plating at 60° C. using "MICROFAB Au660" [Manufactured by Electroplating Engineers of Japan, Ltd.] for obtaining a plated substrate.

(Evaluation)
I. Shape

The photoresist patterns were obtained by the process where the exposure was conducted at the exposure quantity of ES using the above-mentioned mask, and then each pattern was observed with a scanning electron microscope.

In this evaluation, the ES (Effective Sensitivity) means the exposure quantity that the contact hole pattern with hole diameter 20 μm was obtained using the above-mentioned mask. When the profile of pattern was rectangle at both top and bottom sites as shown in FIG. 1(a), it was marked by "○" (good).

When the profile of pattern was a round shape at its top site as shown in FIG. 1(b), it was marked by "X" (bad).

II. Evaluation for Adhesion

Each plated substrate was observed with a scanning electron microscope.

If it was observed that photoresist film discolored due to its corrosion caused by plating solution, it was marked by "X" (bad). If not observed, it was marked by "○" (good).

The results of the evaluation are listed in Table 2.

In the columns showing the results of shapes, the symbols (a) and (b) represent those of the figures corresponding to each shape.

TABLE 2

|  | Shape | Adhesion |
|---|---|---|
| Ex. 1 | ○ (a) | ○ |
| Ex. 2 | ○ (a) | ○ |
| Ex. 3 | ○ (a) | ○ |
| Ex. 4 | ○ (a) | ○ |
| Ex. 5 | ○ (a) | ○ |
| Ex. 6 | ○ (a) | ○ |
| Ex. 7 | ○ (a) | ○ |
| Ex. 8 | ○ (a) | ○ |
| Ex. 9 | ○ (a) | ○ |
| Ex. 10 | ○ (a) | ○ |
| Ex. 11 | ○ (a) | ○ |
| Ex. 12 | ○ (a) | ○ |
| Comp. Ex. 1 | ○ (a) | X |
| Comp. Ex. 2 | ○ (a) | X |
| Comp. Ex. 3 | x (b) | — |

The photoresist composition of the present invention can provide a photoresist film capable of forming a photoresist pattern with fine shape, and shows adhesion firmly to a substrate.

What is claimed is:

1. A photoresist composition comprising:
a novolak resin obtained by condensing a phenol compound with an aldehyde in the presence of a catalyst, said phenol compound being selected from the group consisting of phenol, o-, m- or p-cresol, 2,3-, 2,5-, 3,4- or 3,5-xylenol, 2,3,5-trimethylphenol, 2-, 3- or 4-tert-butylphenol, 2-tert-butyl-4- or 5-methylphenol, 2-, 4- or 5-methylresorcinol, 2-, 3- or 4-methoxyphenol, 2,3-, 2,5- or 3,5-dimethoxyphenol, 2-methoxyresorcinol, 4-t-butylcatechol, 2-, 3- or 4-ethylphenol, 2,5-, 3,5-diethylphenol, 2,3,5-triethylphenol, 2-naphthol, 1,3-, 1,5- or 1,7-dihydroxynaphthalene, and polyhydroxytriphenylmethane compounds obtained by condensing xylenol with hydroxybenzaldehyde;
one resin selected from the group consisting of
a resin which has a structural unit represented by the formula (a1-2):

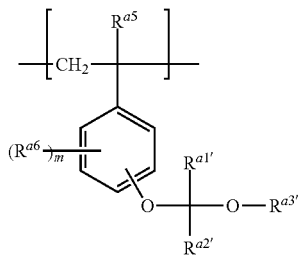

in which $R^{a5}$ represents a hydrogen atom or a methyl group, $R^{a1'}$ and $R^{a2'}$ independently each represent a hydrogen atom or a C1-C12 hydrocarbon group where a methylene group can be replaced by an oxygen atom or a sulfur atom, and $R^{a3'}$ represents a C1-C20 hydrocarbon group where a methylene group can be replaced by an oxygen atom or a sulfur atom, or one of $R^{a1'}$ and $R^{a2'}$ represents a hydrogen atom or a C1-C12 hydrocarbon group where a methylene group can be replaced by an oxygen atom or a sulfur atom, and the other is bonded to $R^{a3'}$ to form a C2-C20 divalent hydrocarbon group where a methylene group can be replaced by an oxygen atom or a sulfur atom, $R^{a6}$ represents a C1-C8 alkyl group or a C1-C8 alkoxy group, m represents an integer of 0 to 4, and a resin obtained by reacting a resin which has a functional group selected from the group consisting of a carboxy group and a phenolic hydroxyl group at a side chain with a compound which has at least two vinyloxy groups;

an acid generator represented by formula (b1):

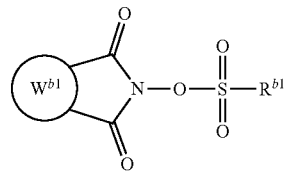

where $R^{b1}$ represents a C1-C18 hydrocarbon group which optionally has a fluorine atom and in which a methylene group optionally has been replaced by an oxygen atom or a carbonyl group, and the ring $W^{b1}$ represents a C6-C14 aromatic hydrocarbon ring which can have a substituent and a C6-C14 aromatic heterocyclic group which optionally has a substituent;

a heterocyclic compound selected from the group consisting of 2-mercaptobenzothiazole, 2-t-butyl-mercaptothiazole and the compounds represented by formulae (I-1) to (I-11), and (I-13):

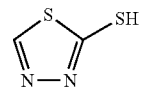

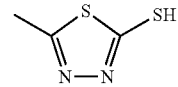

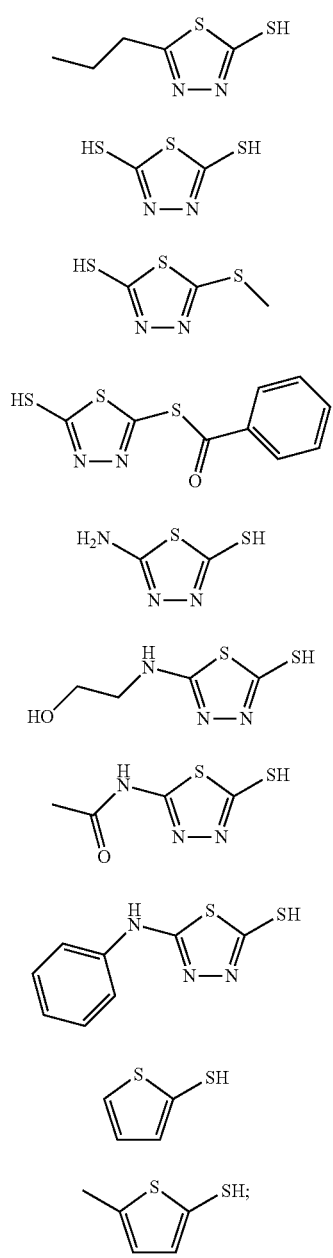

(I-3)
(I-4)
(I-5)
(I-6)
(I-7)
(I-8)
(I-9)
(I-10)
(I-11)
(I-13)

a quencher selected from the amine compounds represented by the formula (C2):

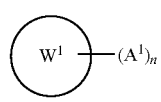

(C2)

wherein the ring $W^1$ is a nitrogen-containing heterocyclic ring selected from the group consisting of the rings represented by formulae (Y13) to (Y15), (Y19) to (Y21), (Y23) to (Y26) and (Y28), $A^1$ represents a phenyl group or a naphtyl group, and n represents an integer of 2 or 3;

 (Y13)

 (Y14)

 (Y15)

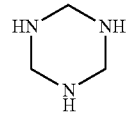 (Y19)

 (Y20)

 (Y21)

 (Y23)

 (Y24)

 (Y25)

 (Y26)

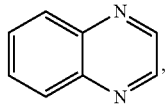 (Y28)

a solvent;
no resin which has a structural unit represented by formula (a1-1):

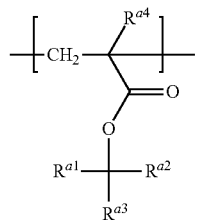

(a1-1)

in which $R^{a1}$, $R^{a2}$ and $R^{a3}$ independently each represent a C1-C8 alkyl group or a C3-C20 alicyclic hydrocarbon group, or two of $R^{a1}$, $R^{a2}$ and $R^{a3}$ are bonded to each other to form a C2-C20 divalent hydrocarbon group and the other is a C1-C8 alkyl group or a C3-C20 alicyclic hydrocarbon group, $R^{a4}$ represents a hydrogen atom or a methyl group, and no acid generator represented by the formula (b2):

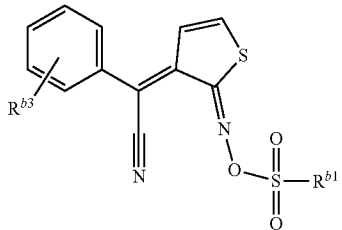

(b2)

where $R^{b1}$ represents a C1-C18 hydrocarbon group which optionally has a fluorine atom and in which a methylene group optionally has been replaced by an oxygen atom or a carbonyl group, and $R^{b3}$ represents a hydrogen atom, a C1-C5 alkyl group or a C1-C5 alkoxy group, and wherein the amount of the solvent is 40% by weight or more and 75% by weight or less of the total amount of the photoresist composition, thereby providing a resist composition for manufacturing a photoresist film having a thickness in the range of 3 μm to 150 μm.

2. A process for producing a photoresist pattern comprising:
(1) a step of applying the photoresist composition according to claim 1 on a substrate,
(2) a step of forming a photoresist composition film by drying the photoresist composition,
(3) a step of exposing the photoresist composition film, and
(4) a step of developing the exposed photoresist composition film.

3. A photoresist film which has the thickness in the range of 3 μm to 150 μm and which is obtained from the photoresist composition according to claim 1.

* * * * *